(12) United States Patent
Koshiishi et al.

(10) Patent No.: US 7,824,930 B2
(45) Date of Patent: Nov. 2, 2010

(54) METHOD OF MANUFACTURING SUBSTRATE, SUBSTRATE MANUFACTURING SYSTEM, AND METHOD OF MANUFACTURING DISPLAY

(75) Inventors: Ryo Koshiishi, Kanagawa (JP); Hideo Kawabe, Saitama (JP); Nobuhiko Mukai, Tokyo (JP); Akiko Tsutsui, Kanagawa (JP)

(73) Assignee: Sony Corporation, Tokyo (JP)

( * ) Notice: Subject to any disclaimer, the term of this patent is extended or adjusted under 35 U.S.C. 154(b) by 101 days.

(21) Appl. No.: 12/100,234

(22) Filed: Apr. 9, 2008

(65) Prior Publication Data

US 2008/0254701 A1 Oct. 16, 2008

(30) Foreign Application Priority Data

Apr. 12, 2007 (JP) ............................. 2007-104597

(51) Int. Cl.
*H01L 21/66* (2006.01)
(52) U.S. Cl. .............................. 438/14; 438/16; 438/17; 438/18; 257/48; 257/E23.179; 257/E21.521; 257/E21.53; 324/500
(58) Field of Classification Search .................. 438/14, 438/16, 17, 18, FOR. 101, FOR. 142; 257/48, 257/E23.179, E21.521, E21.524, E21.53; 324/500
See application file for complete search history.

(56) References Cited

U.S. PATENT DOCUMENTS

| | | | | |
|---|---|---|---|---|
| 5,883,437 A | * | 3/1999 | Maruyama et al. | 257/773 |
| 6,291,268 B1 | * | 9/2001 | Ho | 438/108 |
| 6,583,413 B1 | * | 6/2003 | Shinada et al. | 850/9 |
| 6,597,444 B1 | * | 7/2003 | Halderman et al. | 356/237.1 |
| 6,627,926 B2 | * | 9/2003 | Hartswick et al. | 257/211 |
| 7,015,051 B2 | * | 3/2006 | Shiba | 438/14 |
| 7,586,608 B1 | * | 9/2009 | Gunn et al. | 356/399 |
| 2001/0032387 A1 | * | 10/2001 | Nagasaki et al. | 29/740 |
| 2002/0113234 A1 | * | 8/2002 | Okuda et al. | 257/48 |
| 2003/0096436 A1 | * | 5/2003 | Satya et al. | 438/11 |

FOREIGN PATENT DOCUMENTS

| | | |
|---|---|---|
| JP | 3051623 | 3/2000 |
| JP | 2002-139740 | 5/2002 |
| JP | 2002-268089 | 9/2002 |
| JP | 2003-098547 | 4/2003 |
| JP | 2001-343907 | 12/2004 |
| JP | 2005-186100 | 7/2005 |
| JP | 2005-221974 | 8/2005 |
| WO | 2006/078916 | 7/2006 |

\* cited by examiner

*Primary Examiner*—Julio J Maldonado
*Assistant Examiner*—Su C Kim
(74) *Attorney, Agent, or Firm*—K&L Gates LLP

(57) ABSTRACT

A method of manufacturing a substrate formed with a plurality of wiring patterns on a base, includes: a first inspection step of identifying a faulty wiring pattern having electric short circuit or disconnection by performing an electric inspection respectively for the plurality of wiring patterns; a second inspection step of examining a relative position of a defect on the base and at least one of a type and a size of the defect by an optical inspection; a matching step of matching a result of the first inspection step with a result of the second inspection step, and identifying a critical defect having electric short circuit or disconnection; and a third inspection step of examining a relative position in a pixel and an effective range of the critical defect by an optical inspection.

9 Claims, 24 Drawing Sheets

| DEFECT NUMBER | DEFECT POSITION | TYPE | SIZE | OVERALL POINTS |
|---|---|---|---|---|
| | RELATIVE DISTANCE X | REFLECTANCE R | AREA D | TOTAL SCORE |
| 171A | 100 | 100 | 100 | 300 |
| 171B | 40 | 20 | 0 | 60 |
| 171C | ------- | ------- | ------- | ------- |

| RELATIVE DISTANCE X (μm) | SCORE | REFLECTANCE R (%) | SCORE | AREA D (μm$^2$) | SCORE |
|---|---|---|---|---|---|
| 5 | 100 | 100 | 100 | >400 | 100 |
| 10 | 90 | 90 | 100 | 350 | 90 |
| 20 | 80 | 80 | 100 | 300 | 80 |
| 30 | 60 | 70 | 90 | 250 | 70 |
| 40 | 40 | 60 | 70 | 200 | 60 |
| 50 | 20 | 50 | 50 | 150 | 50 |
| 60 | 15 | 40 | 40 | 100 | 40 |
| 70 | 10 | 30 | 30 | 50 | 30 |
| 80 | 5 | 20 | 20 | 40 | 20 |
| 90 | 0 | 10 | 10 | 20 | 10 |
| 100 | 0 | 0 | 0 | 10 | 0 |

FIG. 22

METHOD OF MANUFACTURING SUBSTRATE, SUBSTRATE MANUFACTURING SYSTEM, AND METHOD OF MANUFACTURING DISPLAY

CROSS-REFERENCES TO RELATED APPLICATIONS

The present application claims priority to Japanese Patent Application JP 2007-104597 filed in the Japanese Patent Office on Apr. 12, 2007, the entire contents of which is being incorporated herein by reference.

BACKGROUND

The present application relates to a method of manufacturing a substrate and a substrate manufacturing system that are suitable for manufacturing a TFT (Thin Film Transistor) substrate or the like used for an organic EL (electroluminescence) display or a liquid crystal display, and a method of manufacturing a display using thereof.

Currently, in an FPD (Flat Panel Display), the size is jumboized, the resolution is improved, and the wiring density is improved. Accordingly, the yield of a TFT substrate is lowered, and a defect repair (laser repair) step is virtually necessary. For example, in a TFT substrate for an organic EL display, a plurality of potential supply wirings exist in addition to a signal wiring and a scanning wiring. Thus, the wiring density in the pixel is improved, and the pixel structure is extremely complicated. Meanwhile, in a TFT substrate for a liquid crystal display, the size of the display has been jumboized and the pixel resolution has been improved assuming a level equal to that of a plasma display. Accordingly, the number of defects per panel is increased, resulting in a disadvantage that the yield is largely lowered.

In the result, tact time necessary for the defect repair step is increased. Thus, many repair devices and many operators are necessitated. In addition, as it is now, most part of the tact time is spent on repair operation time by the operators. Therefore, the investment cost necessary for the defect repair step is largely increased. To reduce the investment cost, it is strongly aspired to reduce the tact time of the defect repair step.

In the past, to address the increased tact time of the defect repair step resulting from the human operators' work, for example, as described in Japanese Patent No 3051623, an automatic repair method has been proposed. In the automatic repair method, pattern matching is made for a TFT shape pattern, and determination is made whether or not repair is to be made. Further, in Japanese Unexamined Patent Application Publication No. 2005-221974, a method of automatically selecting the repair method based on a relative position of a defect is described.

However, the existing method described in Japanese Patent No. 3051623 is limited to repair of the TFT. Therefore, in the existing method, the defect repair step is not able to be automated for defects in wiring patterns other than the TFT that account for a large share of defects.

Further, in Japanese Unexamined Patent Application Publication No. 2005-221974, the defect is extracted based on only an optical inspection result. Thus, it is extremely difficult to select only the critical defect as electric short circuit. Further, in case of repairing all defects, the repair tact time is significantly increased. Further, in the method of selecting the repair procedure considering only the relative position of the defect, an immense database is demanded. In the result, the selection success rate of the repair procedure is lowered, and thus the repair step is hardly automated.

SUMMARY

In view of the foregoing, it is desirable to provide a method of manufacturing a substrate and a substrate manufacturing system capable of reducing the tact time of defect repair of the wiring pattern, and a method of manufacturing a display using thereof.

According to an embodiment, there is provided a first method of manufacturing a substrate formed with a plurality of wiring patterns on a base. The first method of manufacturing a substrate includes the following steps A to D:

A: a first inspection step of identifying a faulty wiring pattern having electric short circuit or disconnection by performing an electric inspection respectively for the plurality of wiring patterns;

B: a second inspection step of examining a relative position of a defect on the base and at least one of a type and a size of the defect by an optical inspection;

C: a matching step of matching a result of the first inspection step with a result of the second inspection step, and identifying a critical defect having electric short circuit or disconnection; and D: a third inspection step of examining a relative position in a pixel and an effective range of the critical defect by an optical inspection.

According to an embodiment, there is provided a second method of manufacturing a substrate formed with a plurality of wiring patterns on a base. The second method of manufacturing a substrate includes the following steps A to D:

A: a first inspection step of identifying a faulty wiring pattern having electric short circuit or disconnection by performing an electric inspection respectively for the plurality of wiring patterns;

B: a second inspection step of examining a relative position of a defect on the base and at least one of a type and a size of the defect by an optical inspection; and C: a grading and matching step of respectively grading a relative position of the defect to the faulty wiring pattern and at least one of the type and the size of the defect, and thereby matching a result of the first inspection step with a result of the second inspection step and identifying a critical defect having electric short circuit or disconnection.

According to an embodiment, there is provided a first substrate manufacturing system for manufacturing a substrate formed with a plurality of wiring patterns on a base. The first substrate manufacturing system includes the following components A to D:

A: a first inspection section for identifying a faulty wiring pattern having electric short circuit or disconnection by performing an electric inspection respectively for the plurality of wiring patterns;

B: a second inspection section for examining a relative position of a defect on the base and at least one of a type and a size of the defect by an optical inspection;

C: a matching section for matching a result of the first inspection section with a result of the second inspection section, and identifying a critical defect having electric short circuit or disconnection; and D: a third inspection section for examining a relative position in a pixel and an effective range of the critical defect by an optical inspection.

According to an embodiment, there is provided a second substrate manufacturing system for manufacturing a substrate formed with a plurality of wiring patterns on a base. The second substrate manufacturing system includes the following components A to D:

A: a first inspection section for identifying a faulty wiring pattern having electric short circuit or disconnection by performing an electric inspection respectively for the plurality of wiring patterns;

B: a second inspection section for examining a relative position of a defect on the base and at least one of a type and a size of the defect by an optical inspection; and C: a grading and matching section for respectively grading a relative position of the defect to the faulty wiring pattern and at least one of the type and the size of the defect, and thereby matching a result of the first inspection section with a result of the second inspection section and identifying a critical defect having electric short circuit or disconnection.

According to an embodiment, there is provided a first method of manufacturing a display. The first method of manufacturing a display includes a repair step of repairing the critical defect after performing the third inspection step and a display device formation step of forming a display device on the substrate with the critical defect repaired, in addition to the first inspection step, the second inspection step, the matching step, and the third inspection step of the foregoing first method of manufacturing a substrate according to the embodiment of the application.

According to an embodiment of the application, there is provided a second method of manufacturing a display forming a display device on a substrate formed with a plurality of wiring patterns on a base. The second method of manufacturing a display includes a repair step of repairing a critical defect after performing the grading and matching step and a display device formation step of forming the display device on the substrate with the critical defect repaired, in addition to the first inspection step, the second inspection step, and the grading and matching step of the foregoing second method of manufacturing a substrate according to the embodiment of the application.

According to the first method of manufacturing a substrate, the first substrate manufacturing system, or the first method of manufacturing a display according to the embodiments of the application, the result of the electric inspection is matched with the result of the optical inspection, and thereby the critical defect having electric short circuit or disconnection is identified. Thus, only the critical defect resulting in an electric fault of the wiring pattern may be automatically and appropriately extracted. Further, the relative position in the pixel and the effective range of the critical defect are examined by the optical inspection. Thus, compared to the case considering only the relative position of the defect in the past, a more suitable repair procedure may be selected. Consequently, the tact time of defect repair of the wiring pattern may be reduced.

According to the second method of manufacturing a substrate, the second substrate manufacturing system, or the second method of manufacturing a display according to the embodiments of the application, when the result of the electric inspection is matched with the result of the optical inspection and thereby the critical defect is identified, the relative position of the defect to the faulty wiring pattern and at least one of the type and the size of the defect are respectively graded. Thus, the success rate of position identification of the critical defect of the wiring pattern may be significantly improved. Consequently, the tact time of defect repair of the wiring pattern may be reduced.

Additional features and advantages are described herein, and will be apparent from the following Detailed Description and the figures.

BRIEF DESCRIPTION OF THE FIGURES

FIG. 22 is a diagram showing an example of a corresponding table referential in the grading and matching step shown in FIG. 21;

28D is a left side view thereof.

DETAILED DESCRIPTION

An Embodiment will be hereinafter described in detail with reference to the drawings.

First Embodiment

Figure 1:
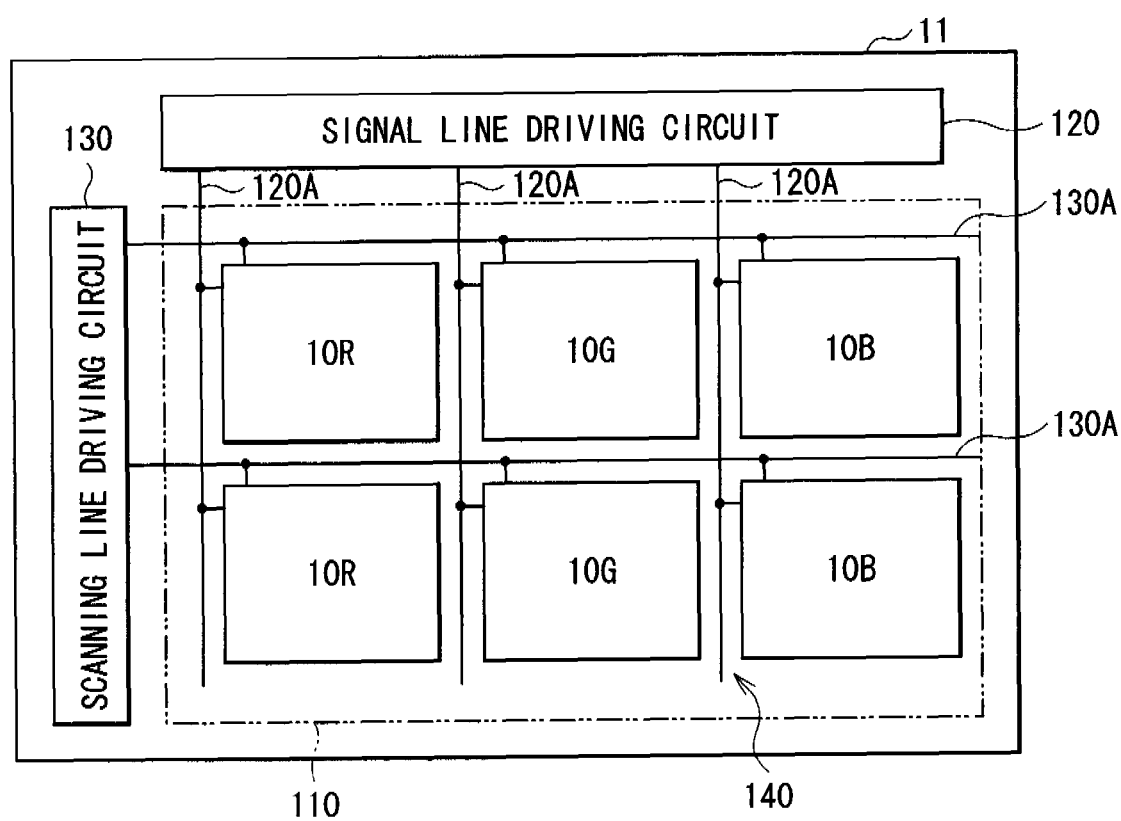
FIG. 1 is a diagram showing a configuration of a display according to a first embodiment.

FIG. 1 shows a configuration of a display manufactured by a method of manufacturing a display according to a first embodiment of the application. The display is used as an ultrathin organic light emitting color display or the like. In the display, for example, a display region 110 in which a plurality of organic light emitting devices 10R, 10G, and 10B described later are arranged in a matrix state is formed on a base (substrate) 11 made of glass. A signal line driving circuit 120 and a scanning line driving circuit 130 that are drivers for displaying an image are formed around the display region 110.

Figure 2:
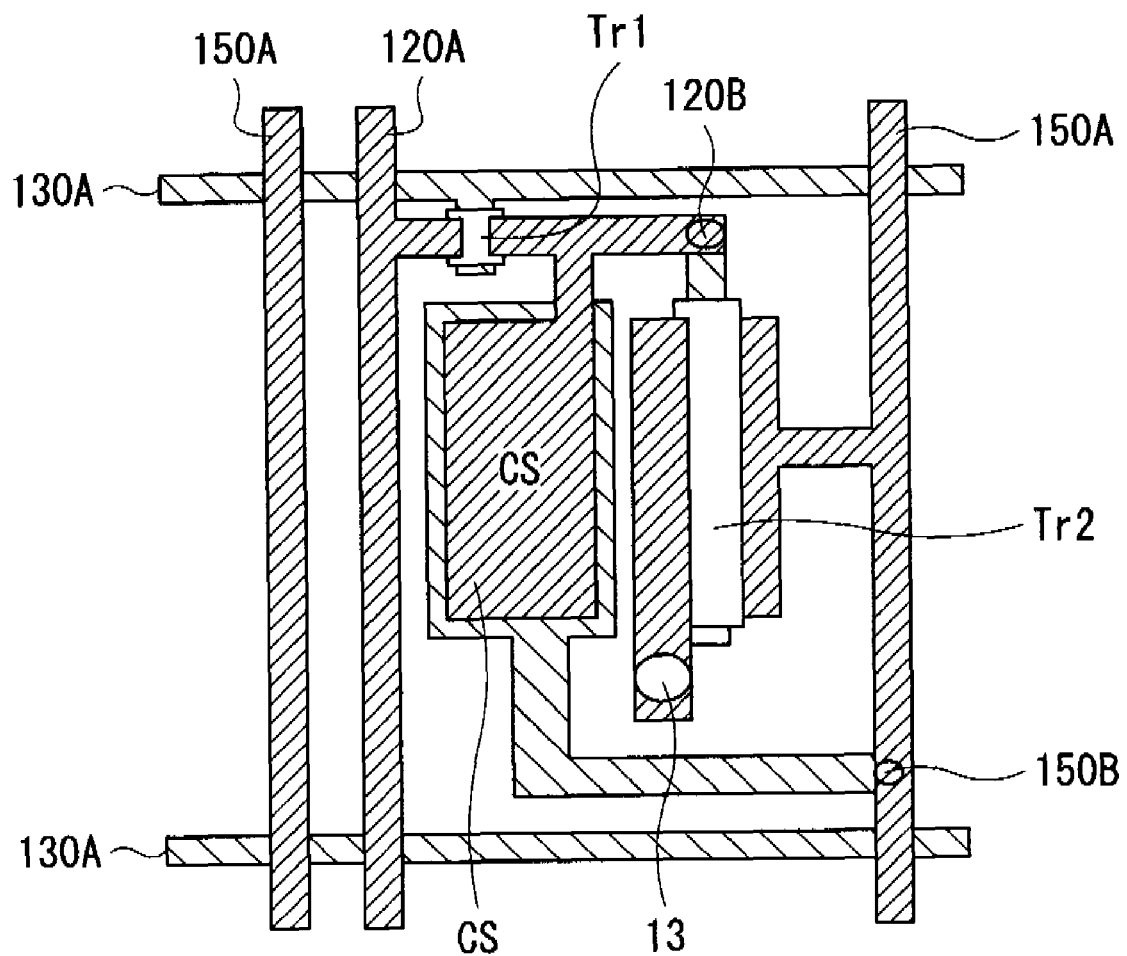
FIG. 2 is a diagram showing an example of the pixel driving circuit shown in FIG. 1.
Figure 3:
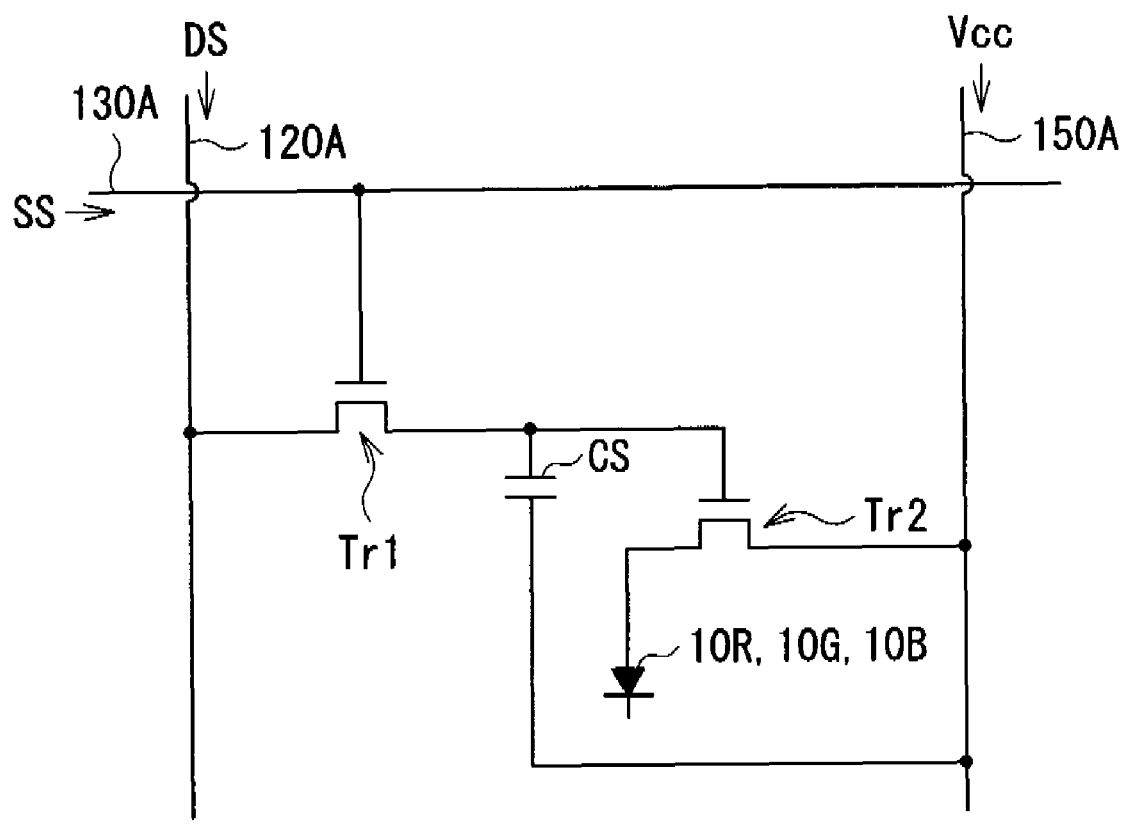
FIG. 3 is a diagram showing an equivalent circuit of the pixel driving circuit shown in FIG. 2.

In the display region 110, a pixel driving circuit 140 is formed. FIG. 2 shows an example of the pixel driving circuit 140. FIG. 3 shows an equivalent circuit thereof. In the pixel driving circuit 140, a plurality of scanning wirings 130A are provided in the row direction on the base 11, and thereon a plurality of signal wirings 120A and a plurality of power source potential supply wirings 150A are extended mainly in the column direction (direction orthogonal to the scanning wiring 130A) with an interlayer insulating film (not shown) in between. Each intersection of each signal wiring 120A and each scanning wiring 130A corresponds to one pixel, that is, one of the organic light emitting devices 10R, 10G, and 10B.

The signal wiring 120A is opposed to a capacitor (retention volume) CS coupled to the power source potential supply wiring 150A through a connection hole 150B with a writing transistor Tr1 in between. The capacitor CS is coupled to a gate wiring of a driving transistor Tr2 through a connection hole 120B. A wiring opposed to the power source potential supply wiring 150A with the driving transistor Tr2 in between is coupled to an after-mentioned first electrode 13 of the organic light emitting devices 10R (10G, or 10B). The scanning wiring 130A, the signal wiring 120A, and the power source potential supply wiring 150A correspond to a specific example of "wiring pattern" of the application. Further, in this specification, in FIG. 2 and the other plan views, to facilitate differentiating the scanning wiring 130A, the signal wiring 120A, and the power source potential supply wiring 150A from each other, the scanning wiring 130A and the wirings connected thereto are affixed with diagonally left up lines, and the signal wiring 120A, the power source potential supply wiring 150A, and the wirings connected thereto are affixed with diagonally right up lines.

Each signal wiring 120A is connected to the signal line driving circuit 120. An image signal DS is supplied to a source electrode of the writing transistor Tr1 from the signal line driving circuit 120 through the signal wiring 120A. Each scanning wiring 130A is connected to the scanning line driving circuit 130. A scanning signal SS is sequentially supplied to a gate electrode of the writing transistor Tr1 from the scanning line driving circuit 130 through the scanning line 130A.

Figure 4:
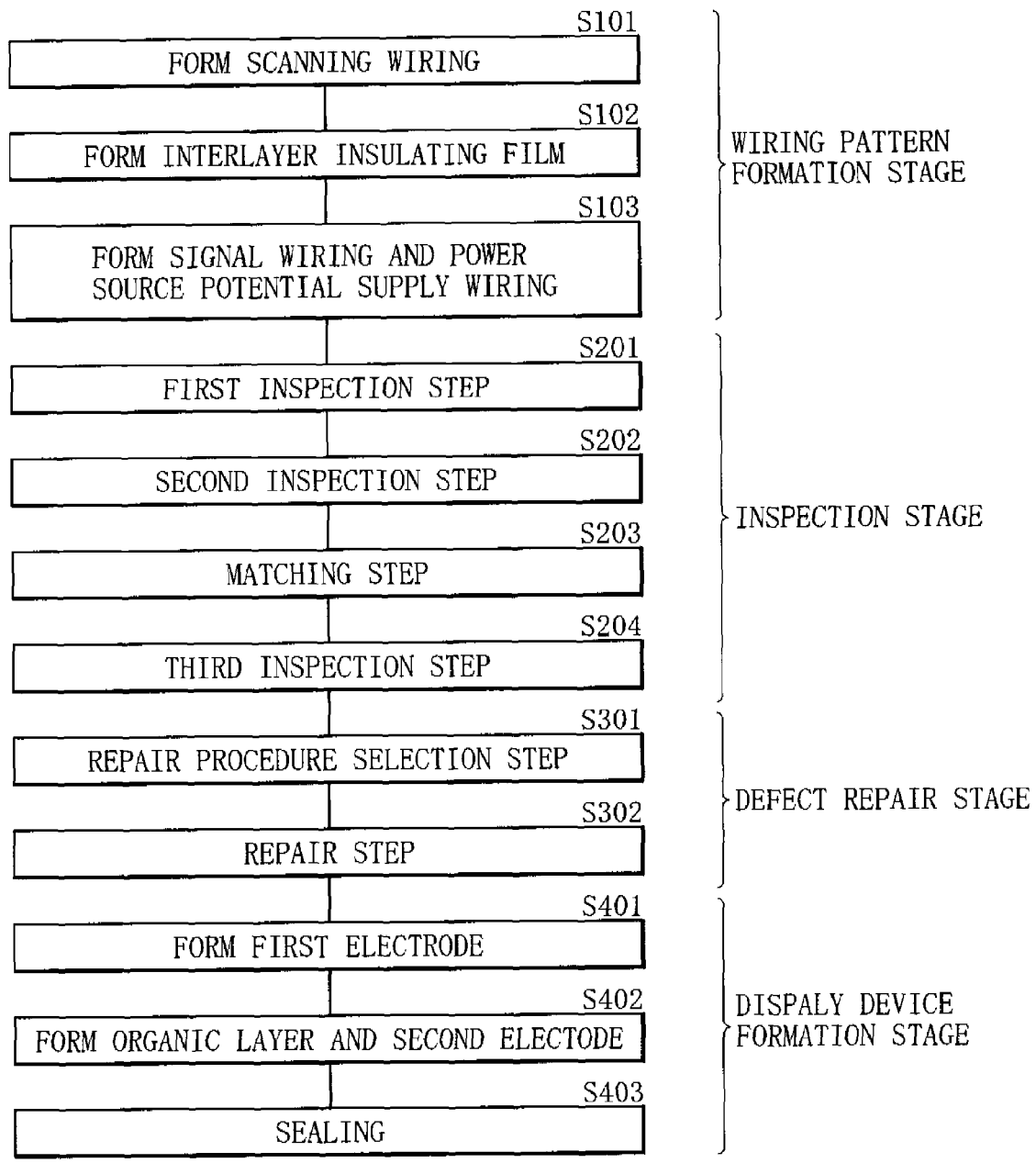
FIG. 4 is a chart showing a flow of a method of manufacturing the display shown in FIG. 1.

FIG. 4 shows a flow of the method of manufacturing the display shown in FIG. 1 to FIG. 3. FIG. 5 to FIG. 14 show the method of manufacturing the display in the order of steps. The method of manufacturing the display is divided into main 4 stages that are, for example, a wiring pattern formation stage, an inspection stage, a defect repair stage, and a display device formation stage. A method of manufacturing a substrate according to the application composes part of the method of manufacturing the display, and thus the method of manufacturing a substrate will be described in conjunction therewith.

Wiring Pattern Formation Stage

First, the plurality of scanning wirings 130A are formed in the row direction on the base 11 made of the foregoing material (step S101), and thereon the interlayer insulating film (not shown) is formed (Step S102). When the interlayer insulating film is formed, an end of the scanning wiring 130A is exposed outside of the display region 110 by etching to form a pad (not shown).

Next, on the interlayer insulating film, the plurality of signal wirings 120A and the plurality of power source potential supply wirings 150A are formed mainly in the column direction (step S103). At this time, the capacitor CS, the writing transistor Tr1, and the driving transistor Tr2 are formed as well. Thereby, the pixel driving circuit 140 shown in FIG. 2 and FIG. 3 is formed.

Inspection Stage

The inspection stage includes, for example, a first inspection step, a second inspection step, a matching step, and a third inspection step.

First Inspection Step

Figure 5:
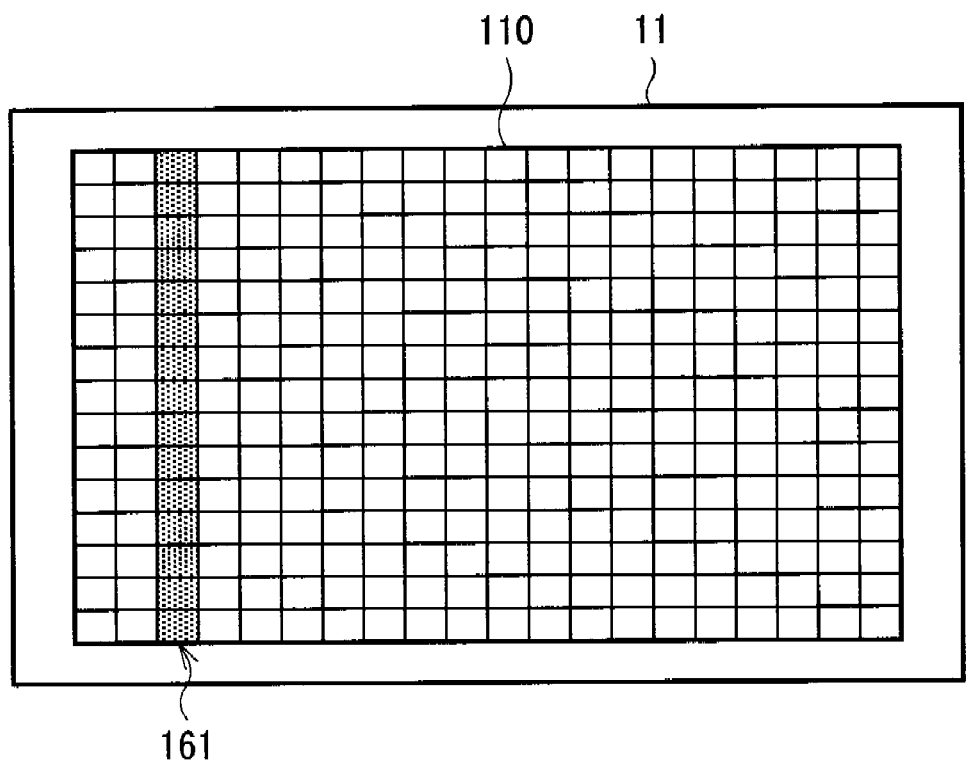
FIG. 5 is a plan view showing the method of manufacturing the display shown in FIG. 4 in the order of steps.

First, an electric inspection is respectively performed for the scanning wiring 130A, the signal wiring 120A, and the power source potential supply wiring 150A. Thereby, as shown in FIG. 5, a faulty wiring pattern 161 electrically short-circuited or disconnected is identified (step S201). In the electric inspection, for example, examination is made whether or not a disconnection defect or a short circuit defect exists in the scanning wiring 130A, the signal wiring 120A, and the power source potential supply wiring 150A by electric charge detection method with the use of an array tester (electric glass substrate inspection device). The electric charge detection method is a method in which electric charge is written into all pixels by the almost same method as the actual operation, the written electric charge is read after given time elapses, and determination is made whether the pixel is good or bad based on the change.

Second Inspection Step

Figure 6:
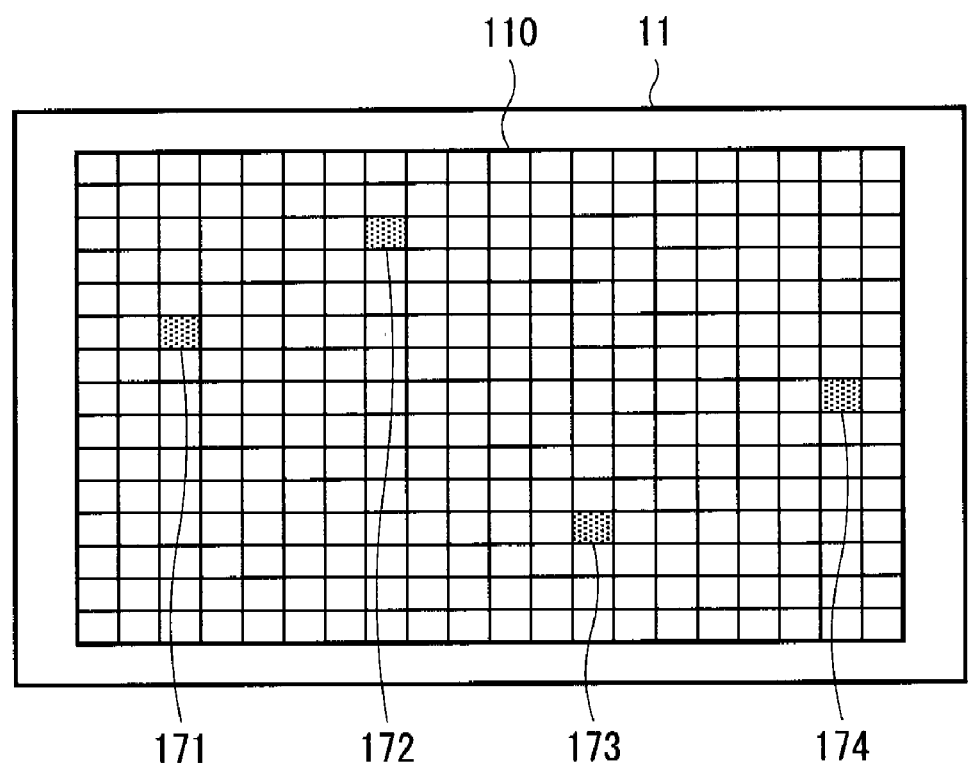
FIG. 6 is a plan view showing a step following FIG. 5.

Next, as shown in FIG. 6, a relative position of defects 171 to 174 on the base 11 and at least one of a type and a size of the defects 171 to 174 are examined by an optical inspection (step S202). The relative position and the size of the defects 171 to 174 are examined by, for example, a pattern inspection. The pattern inspection is a method for detecting abnormality by zooming the pixel driving circuit 140 with the use of a microscope, capturing the image by a CCD (Charge Coupled Device) camera or the like, and processing the image. In such a method, a difference between each pixel and an adjacent pixel thereto is evaluated. If there is a significant difference, determination is made as a fault. The type of the defects 171 to 174 is determined, for example, by using reflected light of the defects 171 to 174. For example, in the case of short circuit, a wiring material frequently remains. In this case, the reflected light of the defects 171 to 174 is almost the same as reflected light of a normal wiring. Meanwhile, in the case of disconnection, the reflected light of the defects 171 to 174 is almost the same as reflected light in a place where no normal wiring exists.

Matching Step

Figure 7:
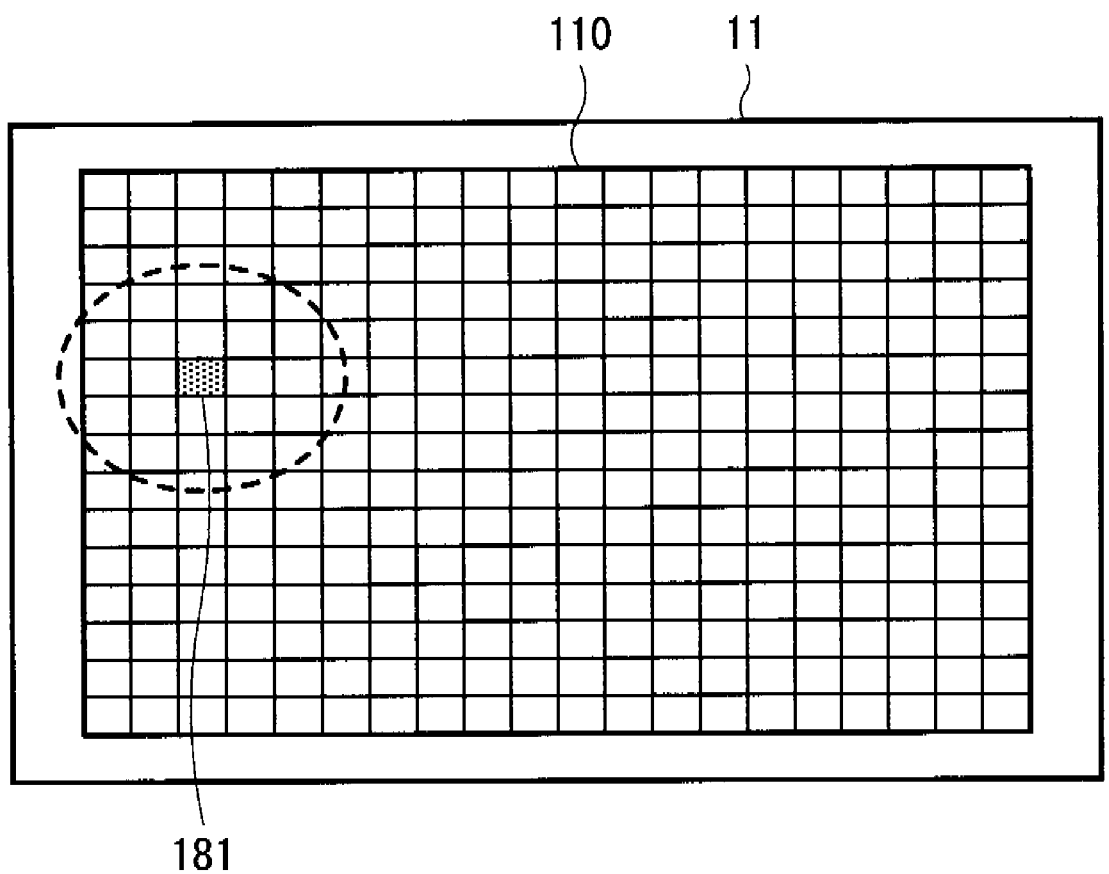
FIG. 7 is a plan view showing a step following FIG. 6.

Subsequently, the result of the first inspection step is matched with the result of the second inspection step. As shown in FIG. 7, a critical defect 181 that is electric short circuit or disconnection is identified (S203). Thereby, in this embodiment, only the critical defect 181 leading to an electric fault is automatically and appropriately extracted, and thus the tact time of defect repair is reduced. The matching may be made by, for example, linking the defect 171 out of the defects 171 to 174 examined in the second inspection step that is located closest to the faulty wiring pattern 161 examined in the first inspection step to the faulty wiring pattern 161. FIG. 7 shows a case that only one critical defect 181 exists. However, it is needless to say that a plurality of critical defects 181 is identified in the same way.

Third Inspection Step

Figure 8:
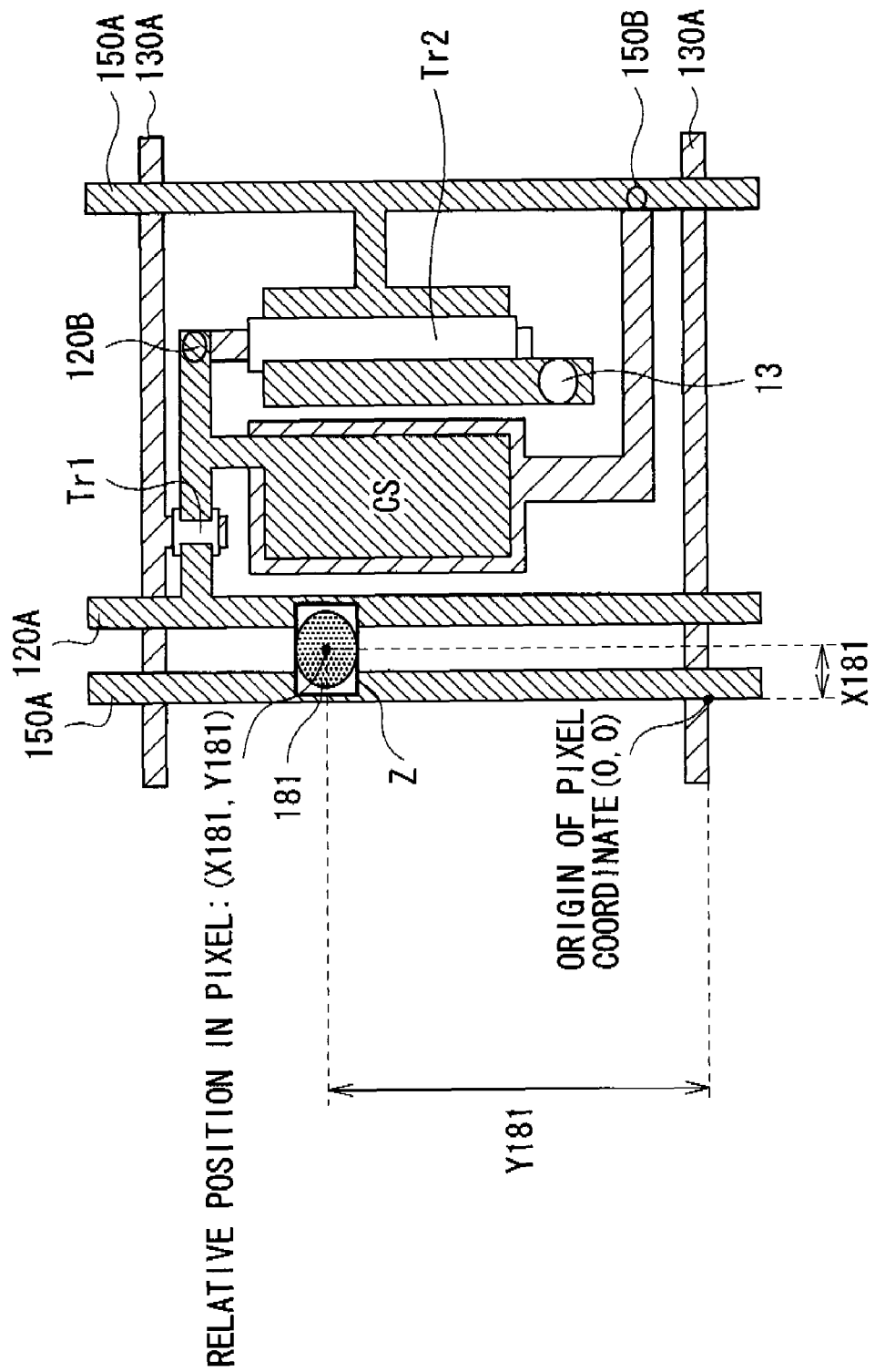
FIG. 8 is a plan view showing a step following FIG. 7.

After that, for the critical defect 181, as shown in FIG. 8, a relative position in the pixel (X181, Y181) and effective range Z are examined by an optical inspection (Step S204). The relative position in the pixel (X181, Y181) is obtained by measuring distance in X direction (X181) and distance in Y direction (Y181) from the origin (0, 0) of the pixel coordinates of the critical defect 181. The effective range Z is rectangle Z that surrounds the critical defect 181. Thereby, in this embodiment, a more suitable repair procedure may be selected and the tact time of defect repair may be reduced, compared to the case considering only the relative position of the defect in the past.

The third inspection step is preferably performed by using the defect repair device for performing the after-mentioned repair step. If another stage optical inspection device is used, slight displacement for each device occurs. In this case, correction or the like should be made again in the repair step.

Defect Repair Stage

After the inspection stage is ended, the critical defect 181 is repaired in the defect repair stage. The defect repair stage includes, for example, a repair procedure selection step and a repair step.

Repair Procedure Selection Step

After the third inspection step is performed, the repair procedure selection step for selecting the repair procedure based on at least the result of the third inspection step is performed before the repair step is performed (step S301). Selecting the repair procedure is preferably made based on the result of the third inspection step and lower layer wiring information of the pixel including the critical defect 181. It is because if the scanning wiring 130A as a lower layer wiring exists in the effective range Z of the critical defect 181 and laser irradiation is made for repairing the critical defect 181, the scanning wiring 130A may be damaged.

Figure 9:
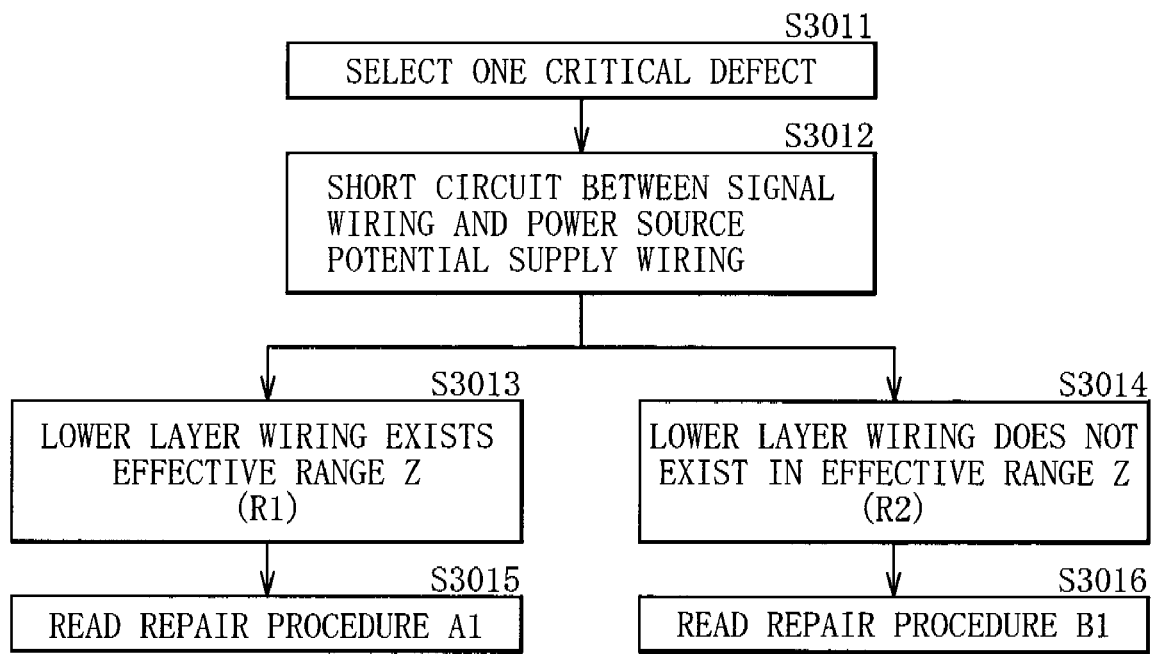
FIG. 9 is a chart for explaining steps following FIG. 8.
Figure 10:
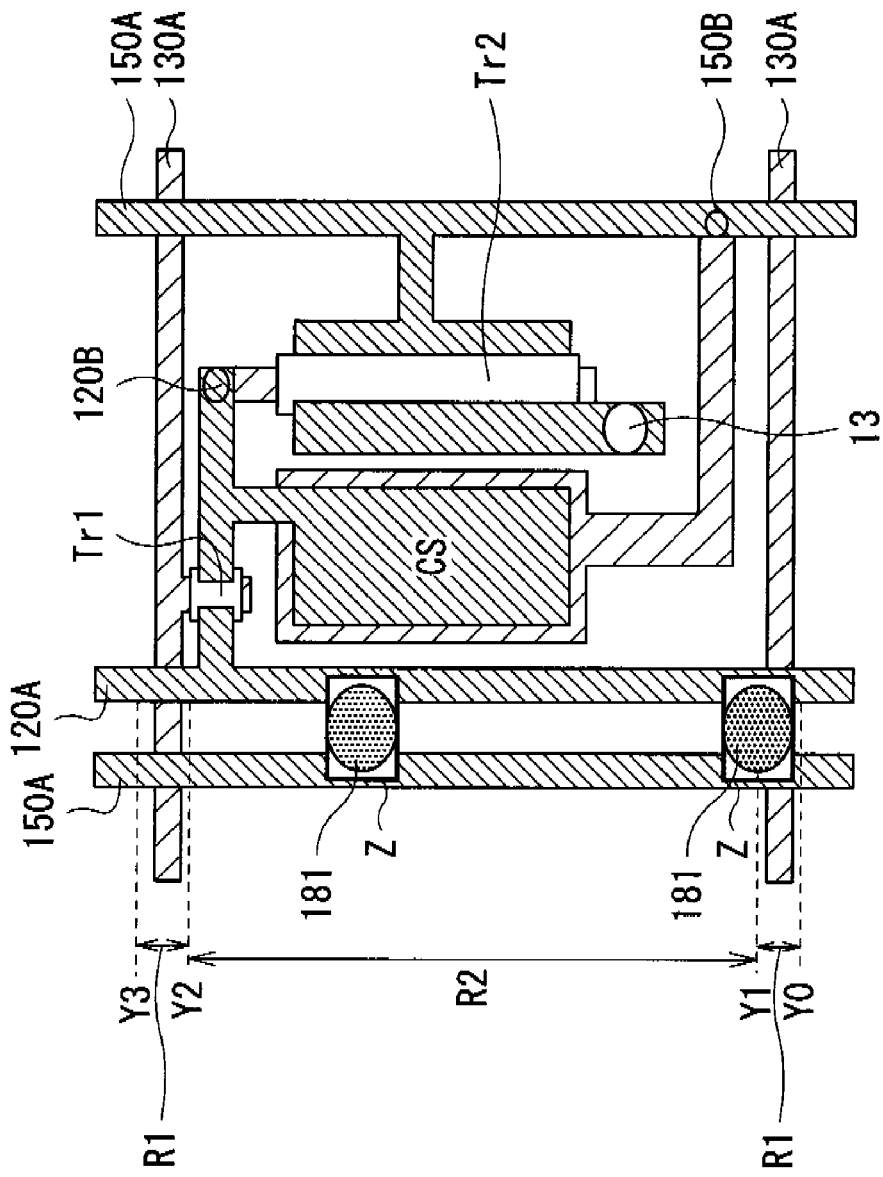
FIG. 10 is a plan view for explaining a step shown in FIG. 9.

With reference to FIG. 9 and FIG. 10, a description will be hereinafter given in detail of selecting the repair procedure in the case that, for example, the critical defect 181 in which the signal wiring 120A and the power source potential supply wiring 150A are short-circuited exists. First, one of the critical defects 181 identified in the matching step is selected (step S3011).

Next, determination is made that the selected critical defect 181 is the short circuit between the signal wiring 120A and the power source potential supply wiring 150A based on, for example, the electric faulty mode of the first inspection step (step S3012).

The pixel driving circuit 140 of the organic light emitting display includes the power source potential supply wiring 150A for driving the organic light emitting devices 10R, 10G, and 10B in addition to the scanning wiring and the signal wiring, compared to a driving circuit for liquid crystal. Further, since the organic light emitting devices 10R, 10G, and 10B are current driven type devices, the transistor size is larger compared to a transistor for liquid crystal. In the result, the wiring density is increased, and the wiring distance between the signal wiring 120A and the power source potential supply wiring 150A becomes narrow. Accordingly, a short circuit defect is easily generated between the both wirings. Such a short circuit defect may have high possibility to result in the critical defect 181 causing an electric fault. If the short circuit defect between the signal wiring 120A and the power source potential supply wiring 150A becomes the critical defect 181, the potential of the signal wiring 120A is fixed to the power source potential, resulting in a line defect when the panel is lighted. Accordingly, defect repair is necessary.

Subsequently, determination is made whether or not the lower layer wiring, that is, the scanning wiring 130A exists in the effective range Z of the critical defect 181 (step S3013 or step S3014).

Specifically, as shown in FIG. 10, first, a region between the signal wiring 120A and the power source potential supply wiring 150A is divided into two types of regions that are region R1 with a lower layer wiring and region R2 without a lower layer wiring, based on presence of the scanning wiring 130A in the lower layer. The region R1 with a lower layer wiring and the region R2 without a lower layer wiring is distinguished based on only the relative position in the Y-axis direction in the pixel. It is hardly necessary to consider the relative position in the X-axis direction. The reason thereof is as follows. Based on the result of the first inspection step, it has been already determined that the critical defect 181 is the short circuit between the signal wiring 120A and the power source potential supply wiring 150A as the electric faulty mode. The relative position in the Y-axis direction in the pixel of the region RI with a lower layer wiring is in the range of from Y0 to Y1 and from Y2 to Y3. Meanwhile, the relative position in the Y-axis direction in the pixel of the region R2 without a lower layer wiring is in the range of from Y1 to Y2.

Next, determination is made whether the critical defect 181 exists in the region R1 with a lower layer wiring or in the region R2 without a lower layer wiring. That is, if the effective range Z of the critical defect 181 is included in the range of from Y0 to Y1 or from Y2 to Y3, determination is made that the critical defect 181 exists in the region R1 with a lower layer wiring and the scanning wiring 130A exists in the effective range Z. In the cases other than that, that is, if the effective range Z of the critical defect 181 is included in the range of from Y1 to Y2, determination is made that the critical defect 181 exists in the region R2 without a lower layer wiring and the scanning wiring 130A does not exist in the effective range Z.

After determination is made whether or not the scanning wiring 130A exists in the effective range Z of the critical defect 181 as described above, reading the repair procedure according to each case is made. That is, if determination is made that the scanning wiring 130A exists in the effective range Z of the critical defect 181, after-mentioned repair procedure A1 is read from the database (step S3015). Meanwhile, if determination is made that the scanning wiring 130A does not exist in the effective range Z of the critical defect 181, after-mentioned repair procedure B1 is read from the database (step S3016).

Since only the scanning wiring 120A exists as the lower layer wiring, the repair procedure for the region R1 with a lower layer wiring is limited to one type of the repair procedure A1. However, if a plurality of lower layer wirings exist, the region between the signal wiring 120A and the power source potential supply wiring 150A may be divided into not only two types of regions that are region R1 with a lower layer wiring and region R2 without a lower layer wiring, but also a larger number of regions.

Repair Step

Next, with reference to FIG. 11 to FIG. 13, a description will be given of specific reading of the repair procedures A1 and B1 (steps S3015 and S3016). The following descriptions will include a description of a repair step of the critical defect 181 by the read repair procedures A1 and B1 (step 302 in FIG. 4).

As the repair procedures A1 and B1, for example, a disconnection procedure by laser irradiation and a connection procedure by laser CVD (Chemical Vapor Deposition) method or metal particle coating method are previously stored in the database, and at least one of the disconnection procedure and the connection procedure is selectively read from the database.

Figure 11:
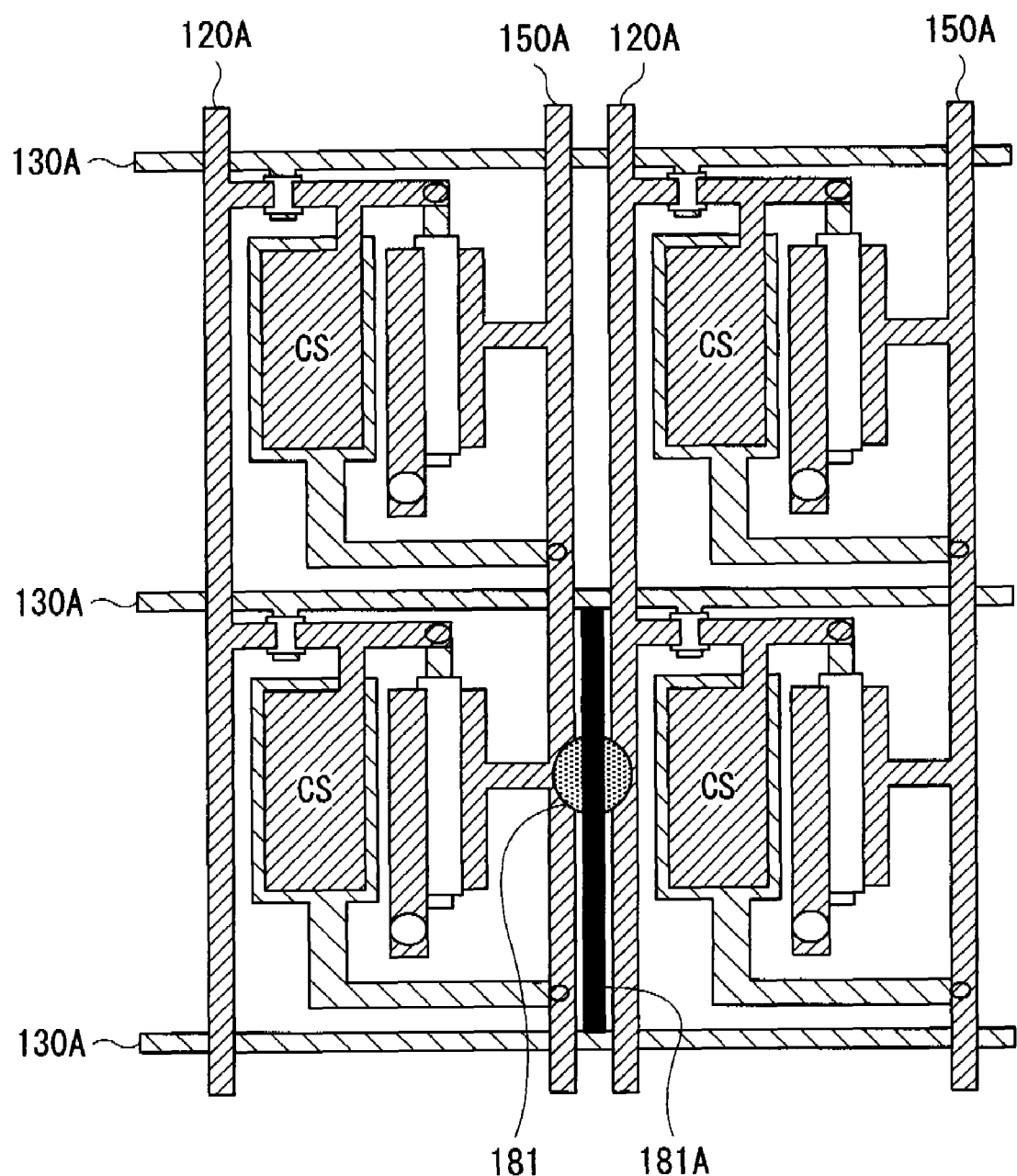
FIG. 11 is a plan view for explaining a step shown in FIG. 9.

For example, as shown in FIG. 11, if determination is made that the scanning wiring 130A does not exist in the effective range Z of the critical defect 181 (step S3014 in FIG. 9), the disconnection procedure is read as the repair procedure B1 (step S3016 in FIG. 9), a disconnection section 181A is formed by laser irradiation to repair the critical defect 181 (step S302 in FIG. 4).

The disconnection section 181A may be formed in the entire region R2 without a lower layer wiring (from Y1 to Y2), or may be limitedly formed only in the effective range Z of the critical defect 181. In the former case, if other short circuit defect (not shown) is generated in the region R2 without a lower layer wiring, it is possible to repair such other defect together with the critical defect 181 by the single repair procedure. In the latter case, it is possible to reduce the laser irradiation time.

Figure 12:
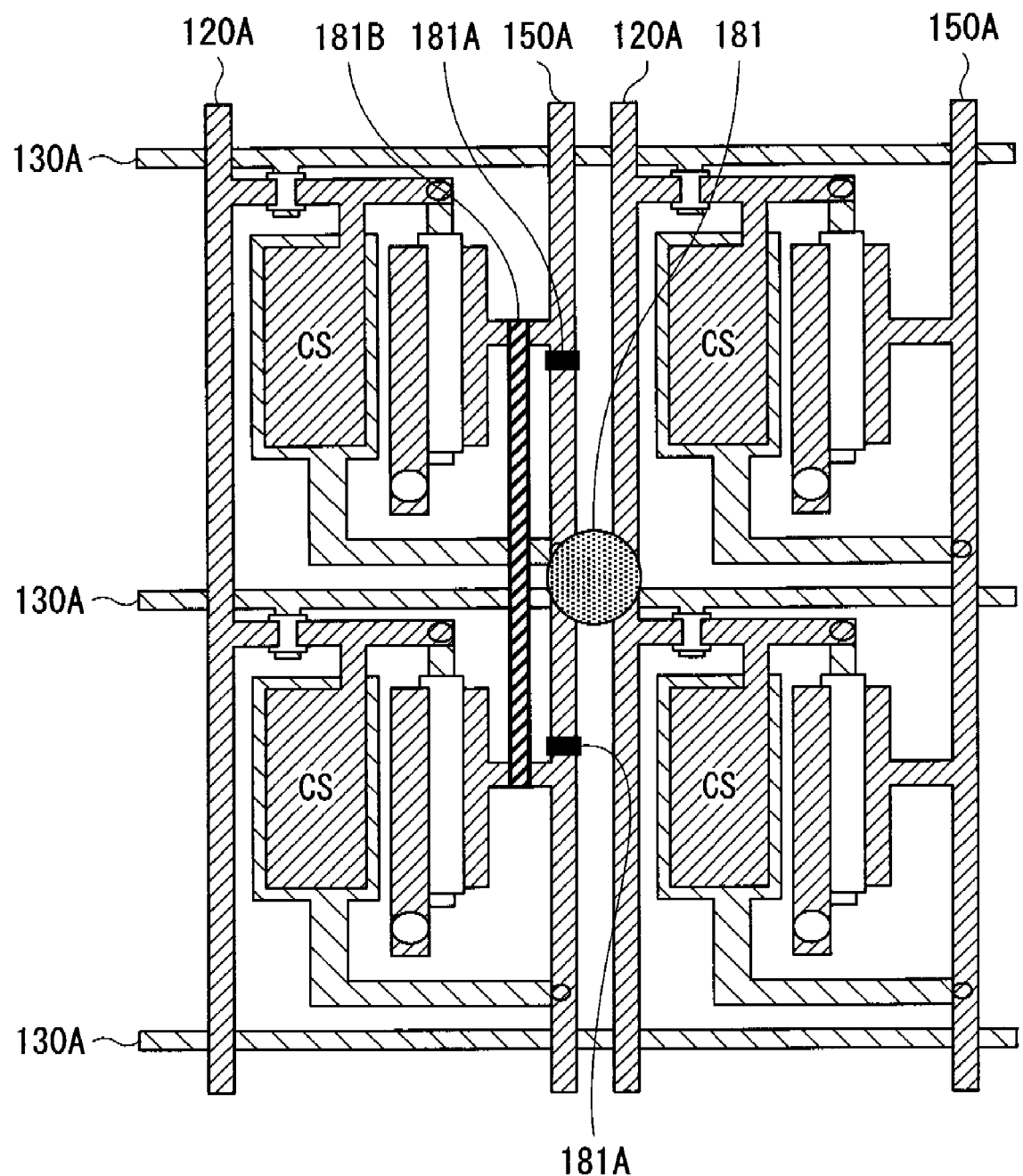
FIG. 12 is a plan view for explaining a step shown in FIG. 9.

Meanwhile, as shown in FIG. 12, if determination is made that the scanning wiring 130A exists in the effective range Z of the critical defect 181 (step S3013 in FIG. 9), at least the connection procedure is preferably read as the repair procedure A1. Differently from the case of FIG. 11, it is difficult to disconnect only the critical defect 181 by laser irradiation, and there is a possibility that the lower layer scanning wiring 130A in the lower layer is damaged. Specifically, in this case, the disconnection procedure and the connection procedure are read as the repair procedure A1 (step S3015 in FIG. 9), the disconnection section 181A is formed on the both ends of the critical defect 181 by the disconnection procedure, and then a connection section 181B is formed by the connection procedure to repair the critical defect 181 (step S302 in FIG. 4). Consequently, the substrate in which the pixel driving circuit 140 including the signal wiring 120A, the scanning wiring 130A, and the power source potential supply wiring 150A is formed on the base 11 is fabricated.

The formation position of the disconnection section 181A is preferably inside of the connection section 181B. If the disconnection section 181A is formed outside of the connection section 181B, a current is not supplied to the pixel thereof, and it may result in a point defect.

Further, the formation position of the connection section 181B is preferably located in a position other than the position on the writing transistor Tr1 or on the driving transistor Tr2. If the connection section 181B is formed on the writing transistor Tr1 or on the driving transistor Tr2, there is a possibility that the writing transistor Tr1 or the driving transistor Tr2 is damaged by heat generated by laser irradiation.

Figure 13:
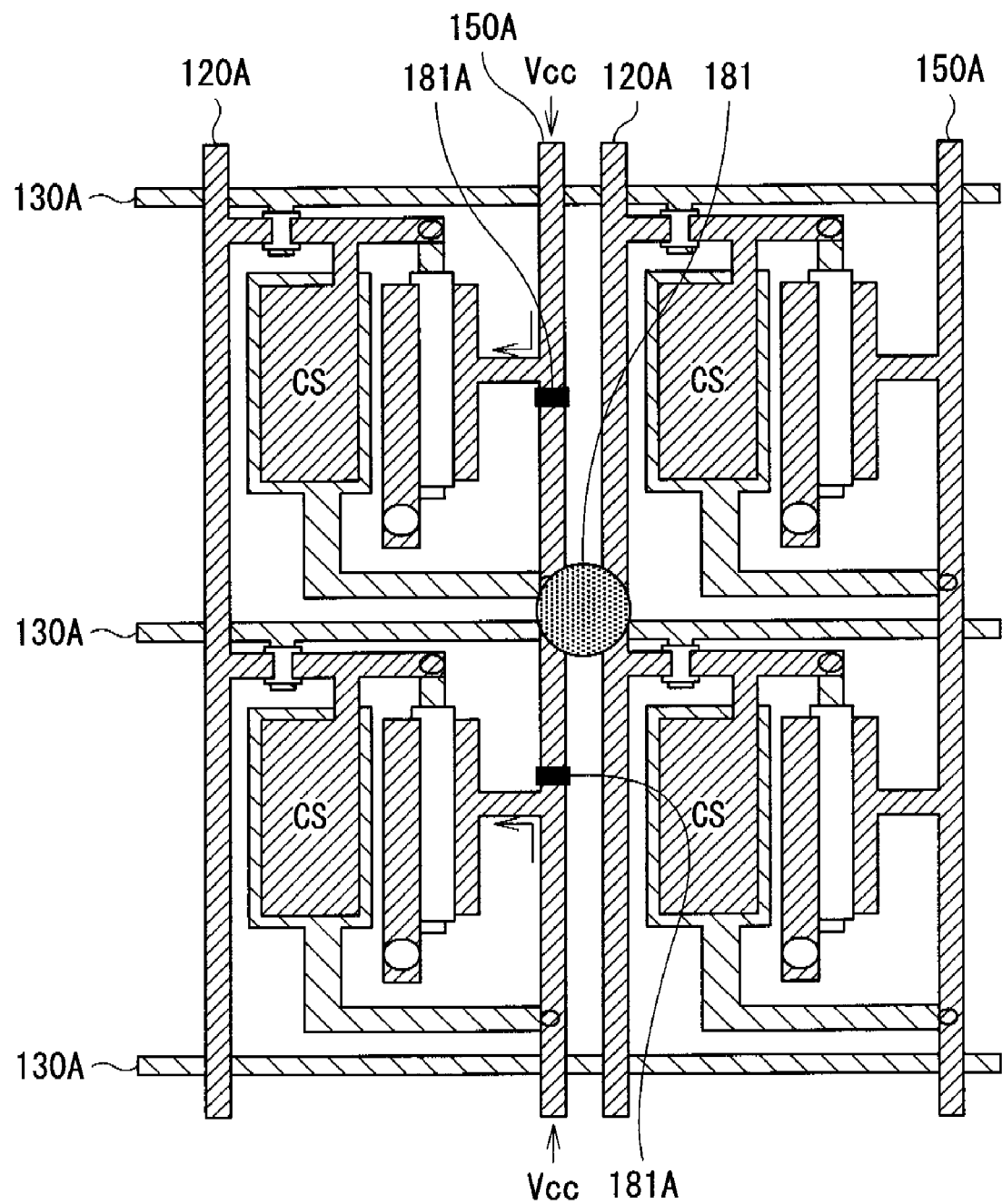
FIG. 13 is a plan view for explaining a step shown in FIG. 9.

In the case that the critical defect 181 is short circuit between the signal wiring 120A and the power source potential supply wiring 150A, and current C is supplied from both the upper direction and the lower direction, as shown in FIG. 13, it is possible that the disconnection procedure is read as the repair procedure A1 (step S3015 in FIG. 9) and the disconnection section 181A is formed on the both ends of the critical defect 181, even if determination is made that the scanning wiring 130A exists in the effective range Z of the critical defect 181 (step S3013 in FIG. 9)

Display Device Formation Stage

First Electrode Formation Step

Figure 14:
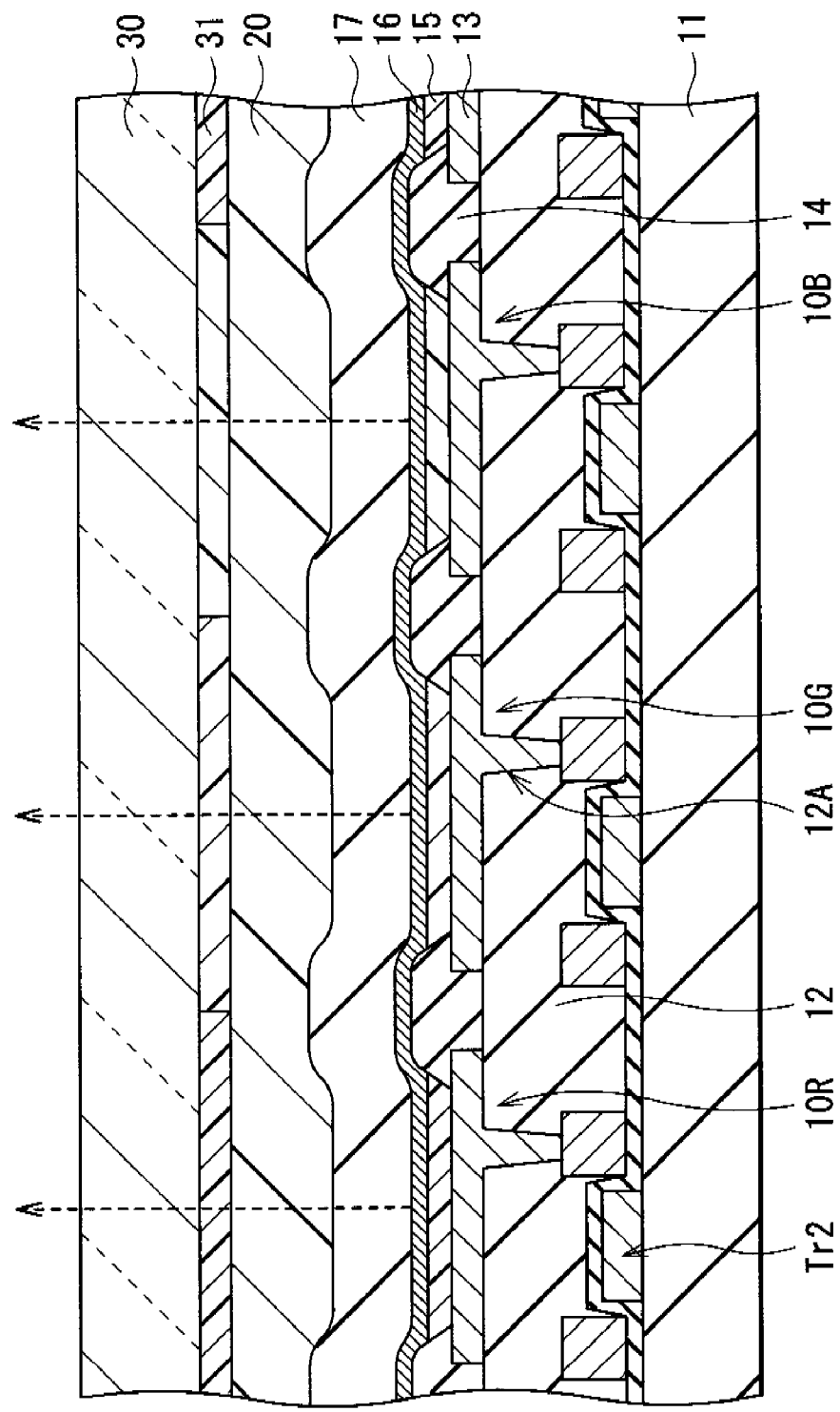
FIG. 14 is a cross section showing steps following FIG. 9.

After the substrate is fabricated by repairing the critical defect 181, as shown in FIG. 14, a planarized insulating film 12 is formed by coating the whole area of the fabricated substrate with a photosensitive resin. Then, the planarized insulating film 12 is patterned in a given shape by providing exposure and development. In addition, a connection hole 12A is formed and the substrate is fired.

Next, a first electrode 13 is formed by, for example, sputtering method (step S401). Then, the first electrode 13 is formed into a given shape by, for example, dry etching.

Subsequently, the whole area of the base 11 is coated with a photosensitive resin and, for example, photolithography is preformed to provide an opening corresponding to the light emitting region. The resultant is fired to form an interelectrode insulating film 14.

Organic Layer and Second Electrode Formation Step

After that, an organic layer 15 composed of an hole-injection layer, an hole-transport layer, a light emitting layer, an electron transport layer, and an electron injection layer, and a second electrode 16 are sequentially formed (step S402). Thereby, the organic light emitting devices 10R, 10G, and 10B are formed.

Sealing Step

After the organic light emitting devices 10R, 10G, and 10B are formed, a protective film 17 is formed by, for example, evaporation method or CVD method.

Further, for example, a sealing substrate 30 is coated with a material of a red filter by spin coat or the like, the resultant is patterned by photolithography technique and fired, and thereby the red filter is formed. Subsequently, as in the red filter, a blue filter and a green filter are sequentially formed. Consequently, a color filter 31 is formed.

After that, an adhesive layer 20 is formed on the protective film 17, and the sealing substrate 30 is bonded to the protective film 17 with the adhesive layer 20 in between (step S403). At this time, the face of the sealing substrate 30 on which the color filter 31 is formed is preferably arranged on the organic light emitting devices 10R, 10G, and 10B side. Consequently, the display shown in FIG. 1 to FIG. 3 is fabricated.

In the display obtained as above, a scanning signal is supplied from the scanning line driving circuit 130 to each pixel through the gate electrode of the writing transistor Tr1. An image signal from the signal line driving circuit 120 is retained in the retention capacity CS through the writing transistor Tr1. That is, the driving transistor Tr2 is on/off-controlled according to the signal retained in the retention capacity CS. Thereby, driving current Id is injected into the respective organic light emitting devices 10R, 10G, and 10B. In the result, electron-hole recombination occurs, and thereby light is emitted. The light is extracted through the second electrode 16, the color filter 31, and then the sealing substrate 30.

Manufacturing System

Figure 15:
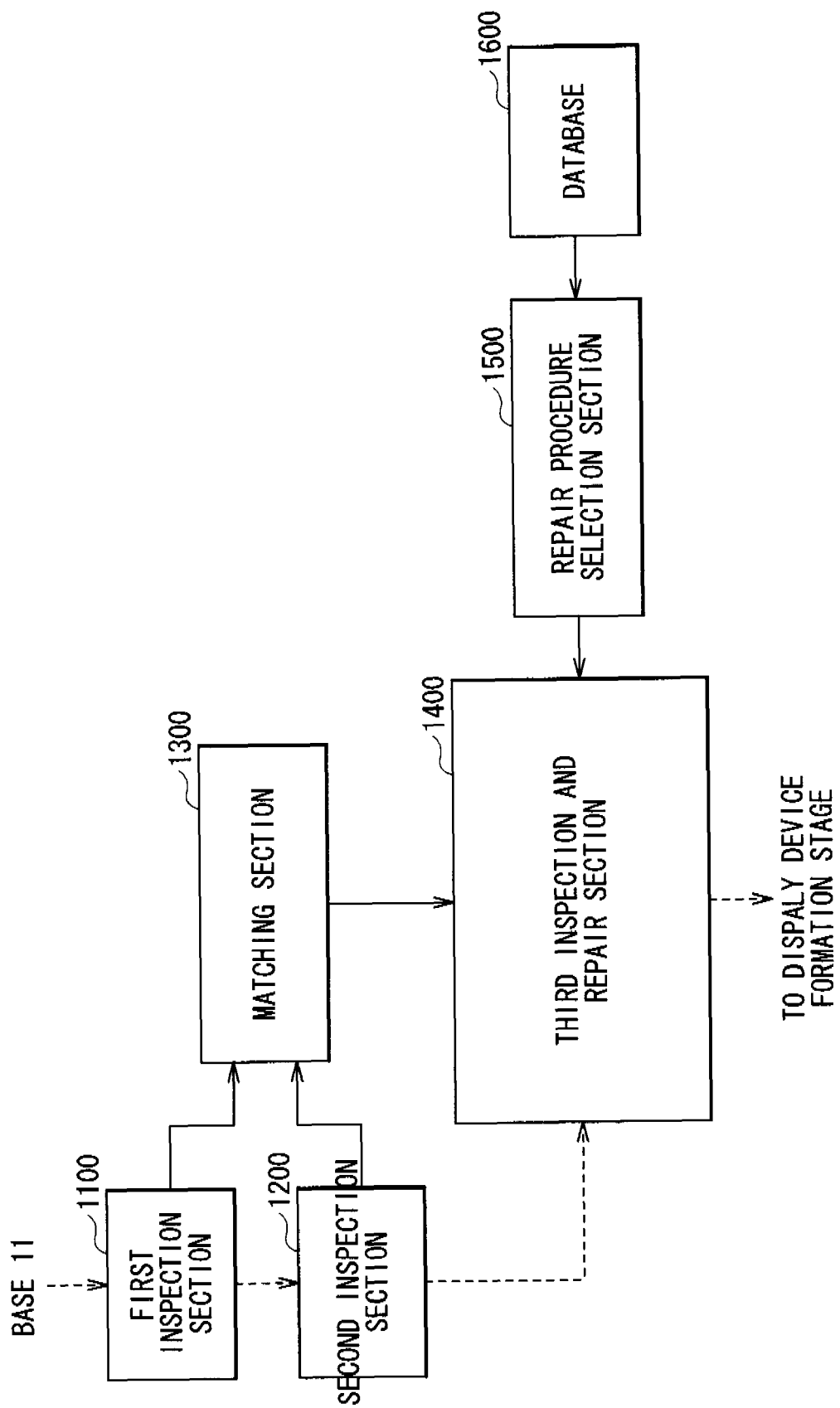
FIG. 15 is a block diagram showing an example of a substrate manufacturing system for performing the inspection stage and the defect repair stage shown in FIG. 4.

FIG. 15 shows an example of a substrate manufacturing system for performing the foregoing inspection stage and the foregoing defect repair stage. A substrate manufacturing system 1000 includes, for example, a first inspection section 1100, a second inspection section 1200, a matching section 1300, a third inspection and repair section 1400, a repair procedure selection section 1500, and a database 1600.

The first inspection section 1100 conducts the foregoing first inspection step, and is composed of, for example, an array tester. The second inspection section 1200 conducts the foregoing second inspection step, and is composed of, for example, a microscope, a capturing section such as a CCD camera, and an image processing section. The matching section 1300 conducts the foregoing matching step based on the inspection results of the first inspection section 1100 and the second inspection section 1200, and is composed of, for example, a computer.

The third inspection and repair section 1400 conducts the foregoing third inspection step and the repair step in the same device. The repair procedure selection section 1500 conducts the foregoing repair procedure selection step, and is composed of, for example, a computer. The database 1600 stores, for example, the disconnection procedure and the connection procedure as the repair procedures A1 and B1 as described above.

Figure 16:
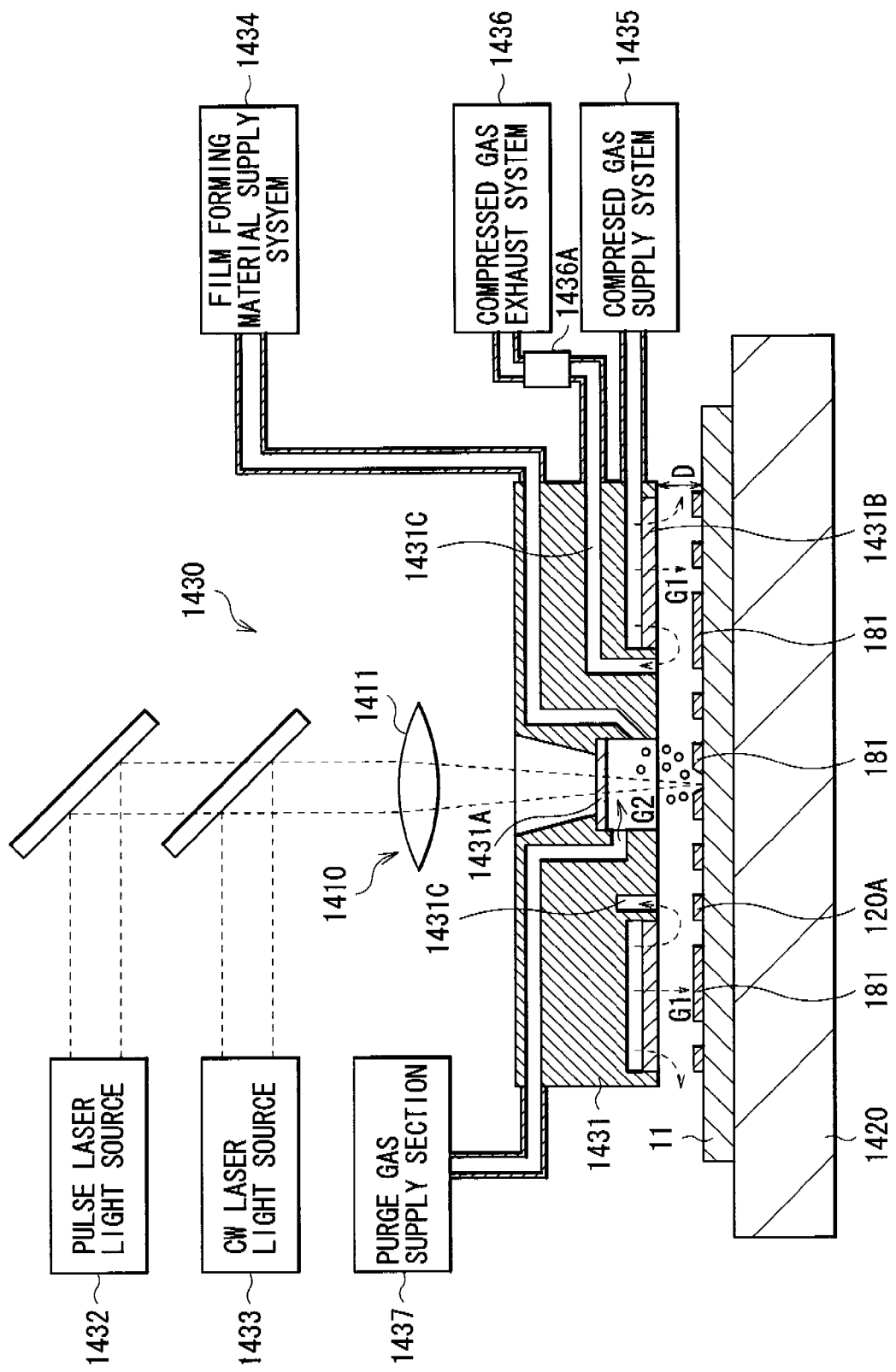
FIG. 16 is a view showing a configuration of the third inspection and repair section shown in FIG. 15.

FIG. 16 shows a configuration of the third inspection and repair section 1400. The third inspection and repair section 1400 includes, for example, an optical system 1410 for observing the critical defect 181, a movement mechanism 1420 for relatively moving the optical system 1410 and the base 11, and a repair mechanism 1430 for repairing the critical defect 181. The optical system 1410 includes, for example, an objective lens 1411. The movement mechanism 1420 is composed of, for example, an X-Y stage.

The repair mechanism 1430 has, for example, a local repair section 1431 provided between the base 11 on the movement mechanism 1420 and the objective lens 1411. The local repair section 1431 has a window 1431A below the objective lens 1411. Through the window 1431A, the third inspection step is performed by observing the critical defect 181, or the repair step is performed by applying laser light LB.

The repair mechanism 1430 further has a pulse laser light source 1432 for laser processing, a CW (Continuous Wave) laser light source 1433 for laser CVD method, a film forming material supply system 1434 for supplying a gas for laser CVD method, a compressed gas supply system 1435, a compressed gas exhaust system 1436, and a purge gas supply system 1437. The film forming material supply system 1434 may supply a coating liquid for metal particle coating method. The compressed gas supply system 1435 floats the local repair section 1431 by using compressed gas G1 such as nitrogen ($N_2$) The compressed gas exhaust system 1436 exhausts the compressed gas G1, and thereby forms a spring having a significantly large spring constant between the local repair section 1431 and the base 11, suppresses change in floating amount D of the local repair section 1431 to improve the floatation rigidity. The purge gas supply system 1437 sprays purge gas G2 such as argon (Ar) gas to the window 1431A to inhibit the wiring material or the like removed by laser processing from being attached to the window 1431A.

Figure 17:
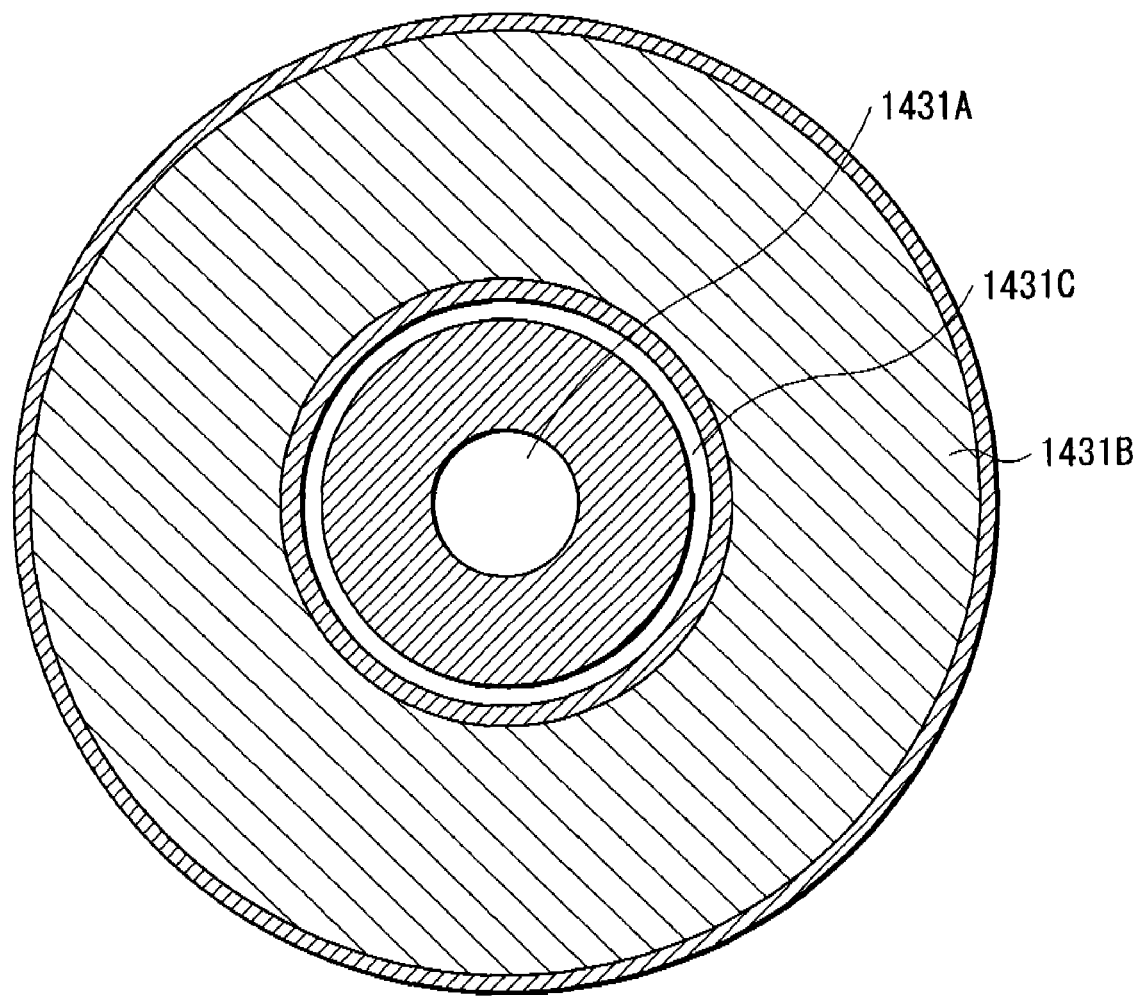
FIG. 17 is a plan view showing a configuration of the local repair section shown in FIG. 16 that is viewed from the bottom face.

On the bottom face of the local repair section 1431, as shown in FIG. 17, a ventilation section 1431B made of porous aluminum for spraying the compressed gas G1 such as nitrogen ($N_2$) and a compressed gas vacuum hole 1431C for exhausting the compressed gas G1 that is flown in the vicinity of the irradiation position of the laser light LB are provided in a concentric fashion. The ventilation section 1431B floats the local repair section 1431 from the base 11 by the compressed gas G1. The compressed gas vacuum hole 1431C vacuums up the compressed gas G1 and exhaust the compressed gas G1 by the compression gas exhaust system 1436.

In the substrate manufacturing system 1000, first, the base 11 is provided with the first inspection step in the first inspection section 1100, the second inspection step in the second inspection section 1200, and the matching step in the matching section 1300. Then, the base 11 is sent in the third inspection and repair section 1400, and is placed on the movement mechanism 1420. If determination is made that the base 11 is not repairable in the first inspection step and the second inspection step, the base 11 is not sent in the third inspection and repair section 1400.

Next, for the base 11 sent in the third inspection and repair section 1400, the critical defect 181 identified in the matching step is automatically selected. The base substance 11 is moved relatively to the optical system 1410, that is, the objective lens 1411 by the movement mechanism 1420, so that the critical defect 181 is in the optical visual field of the optical system 1410.

Subsequently, in the third inspection step, the relative position in the pixel (X181, Y181) and the effective range Z of the critical defect 181 are examined by an optical inspection. Based on the inspection result, the repair procedure selection section 1500 reads one of the repair procedures A1 and B1 from the database 1600.

After that, the base 11 is moved by the movement mechanism 1420 so that the irradiation position of the laser light LB from the pulse laser light source 1432 or the CW laser light source 1433 is located in a position suitable for the read repair procedure A1 or B1. Then, the critical defect 181 is repaired by laser processing method or laser CVD method.

In the third inspection and repair section 1400, it is preferable that the local repair section 1431 is previously floated before the third inspection step and the repair step are performed. Thereby, it is possible for the local repair section 1431 to be prevented from being contacted with the base 11 and damaging the base 11. To float the local repair section 1431, for example, compressed nitrogen having a pressure of 0.2 MPa as the compressed gas G1 is supplied from the compressed gas supply system 1435, and the compressed gas G1 is sprayed toward the base 11 through the ventilation section 1431B.

Further, it is preferable that the purge gas supply mechanism 1437 sprays, for example, nitrogen gas of 200 ccm as the purge gas G2.

Further, it is preferable that after starting the supply of the compressed gas G1 and the purge gas G2, the compressed gas exhaust system 1436 starts exhaust, a valve 1436A controls the pressure or the flow volume of the compressed gas G1, and the floating amount D of the local repair section 1431 is kept small as much as possible such as 10 μm. Thereby, it is possible that a spring having a significantly large spring constant is formed between the local repair section 1431 and the base 11, inhibits change in floating amount D of the local repair section 1431 to improve the floatation rigidity.

As described above, in this embodiment, the result of the electric inspection in the first inspection step is matched with the result of the optical inspection in the second inspection step in the matching step, and thereby the critical defect 181 that is electric short-circuit or disconnection is identified. Therefore, only the critical defect 181 leading to an electric fault of the signal wiring 120A, the scanning wiring 130A, or the power source potential supply wiring 150A is automatically and appropriately extracted. Further, in the third inspection step, the relative position in the pixel (X181, Y181) and the effective range Z of the critical defect 181 are examined by the optical inspection. Thus, compared to the case considering only the relative position of the defect in the past, a more suitable repair procedure may be selected. Therefore, the tact time of defect repair of the signal wiring 120A, the scanning wiring 130A, or the power source potential supply wiring 150A may be reduced.

In particular, the repair procedure A1 or B1 is selected based on the result of the third inspection step and the lower layer wiring information of the pixel including the critical defect 181. Thus, if the scanning wiring 130A as the lower layer wiring exists in the effective range Z of the critical defect 181, the scanning wiring 130A is inhibited from being damaged by, for example, laser irradiation for repairing the critical defect 181.

Further, in particular, if determination is made that the scanning wiring 130A exists in the effective range Z of the critical defect 181, at least the connection procedure is read as the repair procedure A1. Thus, it is possible to eliminate the difficult operation that only the critical defect 181 is disconnected without damaging the scanning wiring 130A in the lower layer by laser irradiation.

The repair procedure may be selected regardless of presence of the scanning wiring 130A in the effective range Z of the critical defect 181. A description will be hereinafter given of a first modification and a second modification as an example thereof.

First Modification

Figure 18:
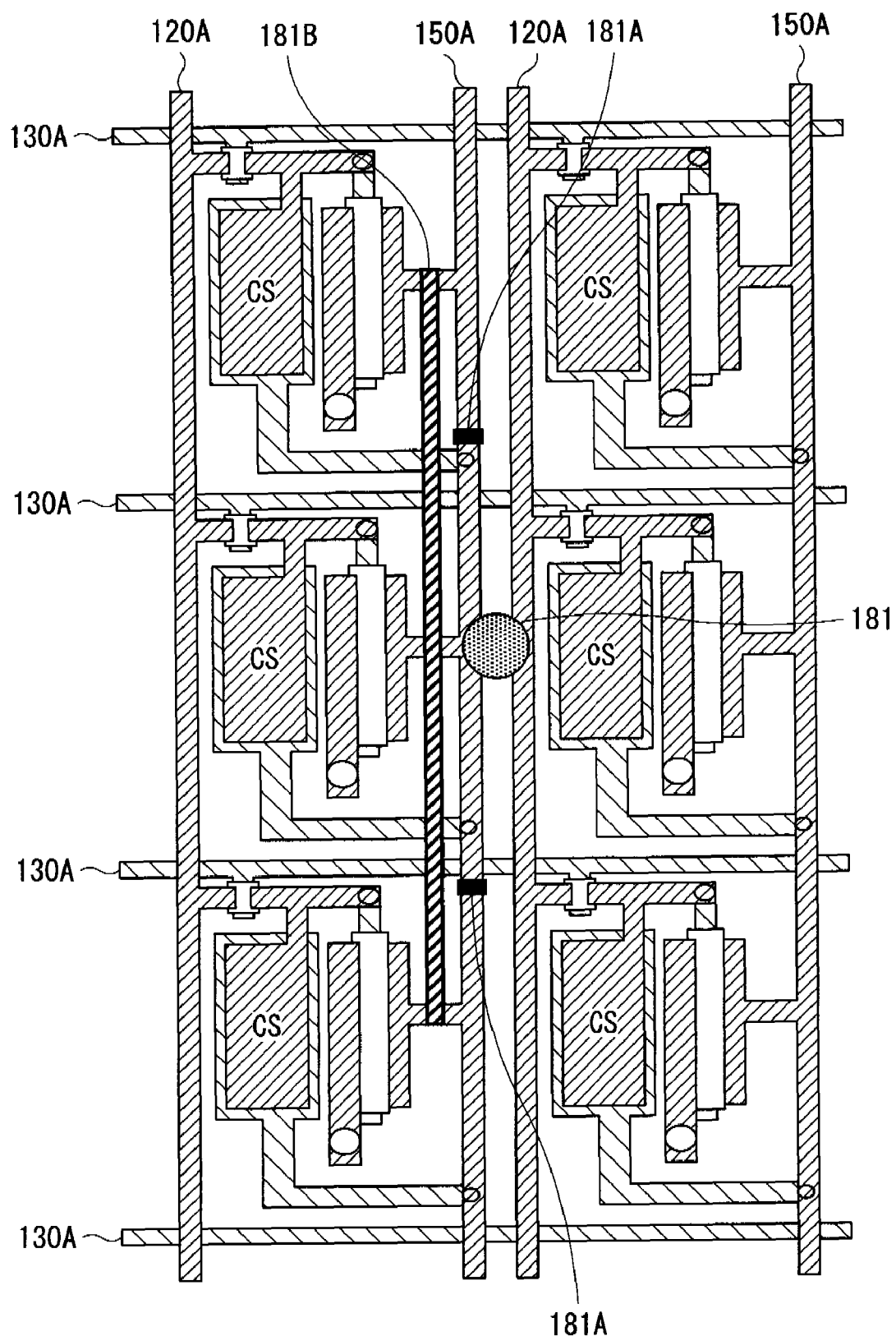
FIG. 18 is a plan view for explaining a first modification, of an embodiment.

FIG. 18 is a view for explaining a repair procedure of the first modification of the application. In the first modification, even if determination is made that the scanning wiring 130A does not exist in the effective range Z of the critical defect 181, both the disconnection procedure and the connection procedure are read in the same manner as that of the repair procedure A1 for the case that the scanning wiring 130A exists in the effective range Z of the critical defect 181. That is, first, the disconnection section 181A is formed in the power source potential supply wiring 150A in a position outside of the pixel including the critical defect 181. Next, a passivation film (not shown) is formed on the pixel driving circuit 140. The both ends of the disconnection section 181A are connected on the passivation film by the connection section 181B. In the passivation film, it is necessary that a connection hole between the power source potential supply wiring 150A and the connection section 181B is previously formed by, for example, etching or the like.

As described above, in the first modification, it is not necessary to select the repair procedure A1 or B1, the single repair procedure is applied to one type of electric short circuit mode, and failure in selecting the repair procedure may be eliminated. On the contrary, in this first modification, the power source potential supply wiring 150A of the pixel including the critical defect 181 is disconnected. Thus, there is a possibility that the driving transistor Tr2 of the pixel is not driven normally, resulting in a point defect. Further, there is an issue that since the positions outside of the pixel are connected by the connection section 181B, the connection distance of the connection section 181B becomes long, and it becomes hard to reduce the tact time.

Second Modification

Figure 19:
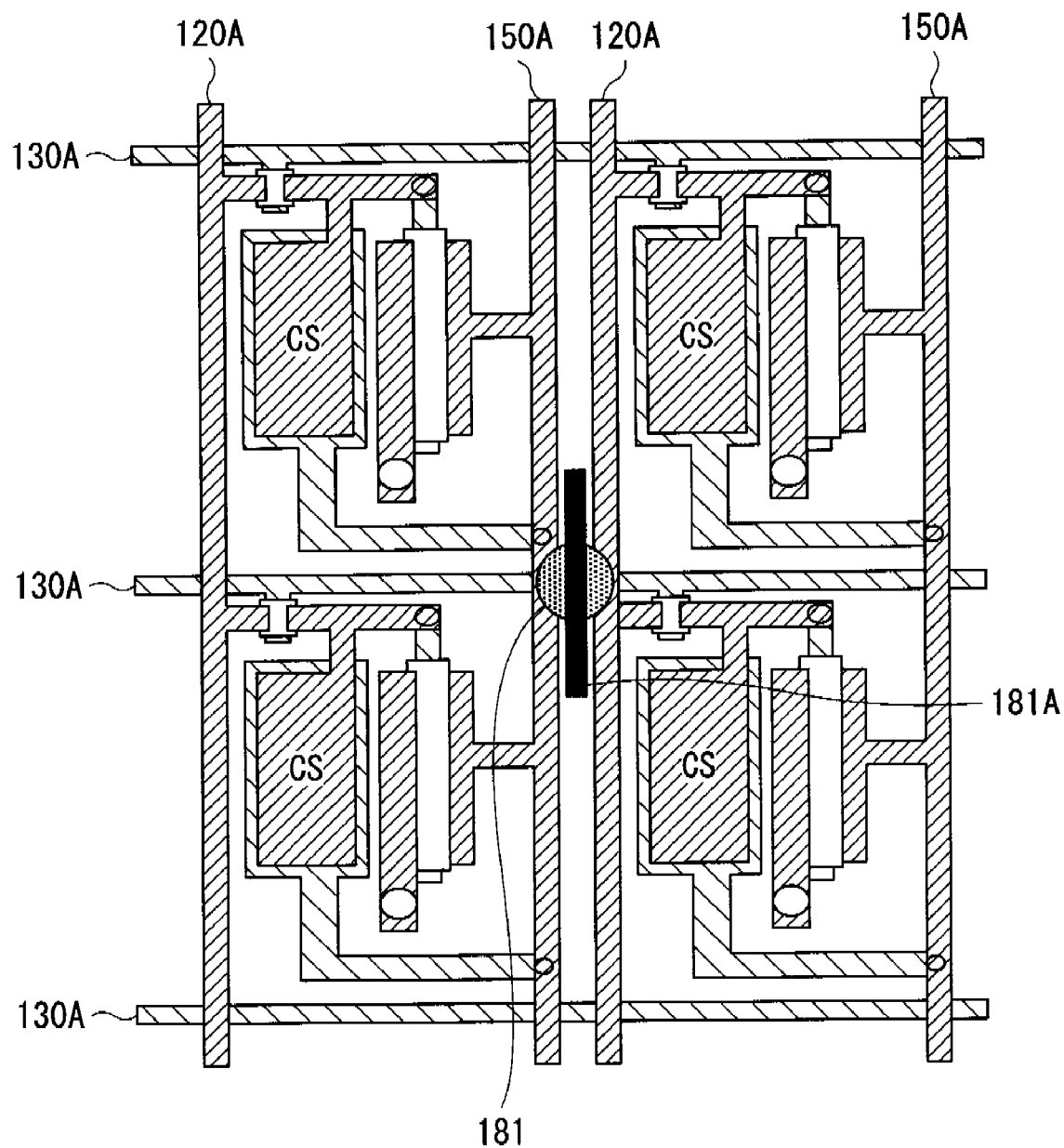
FIG. 19 is a plan view for explaining a second modification of an embodiment.

FIG. 19 is a view for explaining a repair procedure according to the second modification. In the second modification, even if determination is made that the scanning wiring 130A exists in the effective range Z of the critical defect 181, in the same manner as that of the repair procedure B1 for the case that the scanning wiring 130A does not exist in the effective range Z of the critical defect 181, only the disconnection procedure is read, the disconnection section 181A is formed by laser irradiation to repair the critical defect 181. In this case, in order to repair the critical defect 181 without damaging the scanning wiring 130A, it is necessary to use a short pulse width laser having 10 psec or less, since the pulse width is necessary to be 10 psec or less in order to keep the thermal diffusion length of the metal material down to 0.1 μm or less.

As described above, in the second modification, it is not necessary to select the repair procedure A1 or B1, the single repair procedure is applied to one type of electric short circuit mode, and failure in selecting the repair procedure may be eliminated. Further, even if determination is made that the scanning wiring 130A exists in the effective range Z of the critical defect 181, the critical defect 181 is repaired by laser processing. Thus, the tact time may be largely reduced.

Second Embodiment

Figures 20, 21:
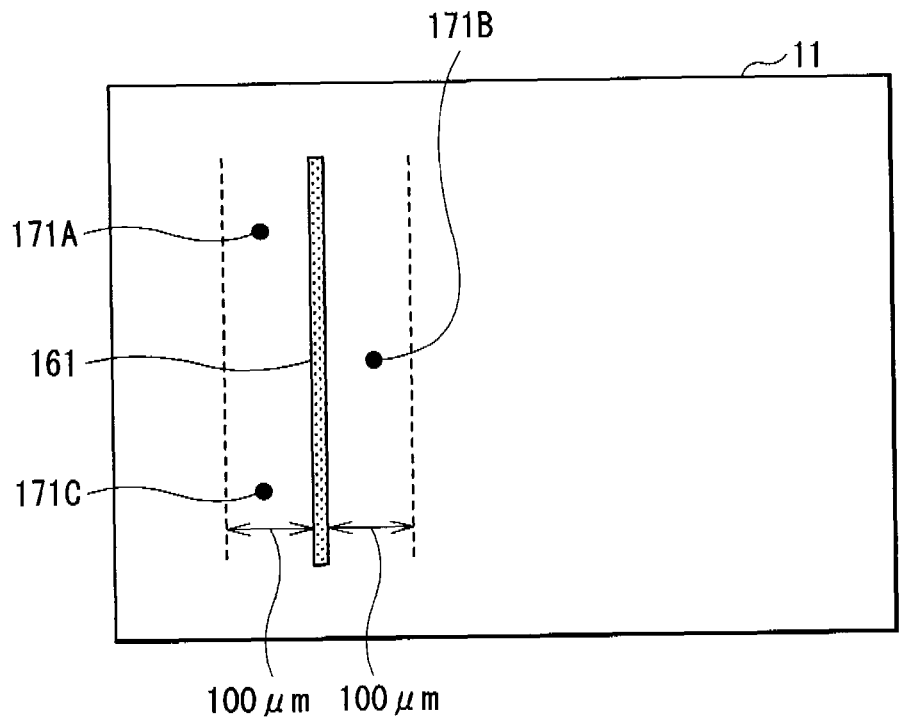
FIG. 20 is a diagram for explaining a method of manufacturing a display according to a second embodiment.
FIG. 21 is a diagram showing a step following FIG. 20.

FIG. 20 and FIG. 21 are diagrams for explaining a method of manufacturing a display according to a second embodiment of the application. The method of manufacturing a display is the same as the method of manufacturing a display described in the first embodiment, except that a grading and matching step is performed instead of the matching step of the foregoing first embodiment. In the grading and matching step, the relative position of the defect to the faulty wiring pattern 161 and at least one of the type and the size of the defect are respectively graded, and thereby the critical defect 181 is identified. Therefore, a description will be given by affixing the same symbols to the same elements as those of the first embodiment.

First, in the same manner as that of the first embodiment, after the wiring pattern formation step is performed, the procedure proceeds to the inspection step, where the first inspection step and the second inspection step are performed.

Grading and Matching Step

Next, in the grading and matching step, the relative position of the defect to the faulty wiring pattern 161 and at least one of the type and the size of the defect are respectively graded, and thereby the critical defect 181 is identified. Thereby, in this embodiment, the success rate of position identification of the critical defect 181 may be significantly improved.

That is, in the case that in the second inspection step, a plurality of defects are detected in the vicinity of the faulty wiring pattern 161 identified in the first inspection step, if the defect detected in the location closest to the faulty wiring pattern 161 is identified as the critical defect 181, the identification success rate may be lowered. This is because there is a possibility that a defect having a size incapable of becoming an electric fault is detected in the vicinity of the faulty wiring pattern 161.

Therefore, first, for example, as shown in FIG. 20, a plurality of defects 171A to 171C located within a given range, for example within 100 μm from the faulty wiring pattern 161 are extracted.

Next, as shown in FIG. 21, for the respective defects 171A to 171C, a relative position to the faulty wiring pattern 161, and a type and a size of the defects 171A to 171C are respectively graded. At this time, for example, with reference to a corresponding table as shown in FIG. 22 as an example, the relative position is graded as follows. That is, based on the X coordinate from the origin (0,0) of the base 11 of the defects 171A to 171C examined in the second inspection step, if the relative distance X from the faulty wiring pattern 161 is 5 μm, the score of the relative position is 100; and the relative distance X from the faulty wiring pattern 161 is 40 μm, the score of the relative position is 40. The type is graded as follows. That is, based on reflectance R of the defects 171A to 171C examined in the second inspection step, if R is 100%, the score of the type is 100; and if R is 20%, the score of the type is 20. The size is graded as follows. That is, based on area D of the defects 171A to 171C examined in the second inspection step, if the area D is larger than 400 μm$^2$, the score of the size is 100; and if the area D is 10 μm$^2$ or less, the score of the size is 0. In the case where the size of defect is 10 μm$^2$ or less, there is almost no possibility that it leads to an electric fault. The critical defect 181 is surely identified by obtaining overall points T of the scores of the relative distance X, the reflectance R, and the area D.

After the grading and matching step is performed, the defect repair stage and the display device formation stage are performed in the same manner as those of the first embodiment.

As described above, in this embodiment, the relative position of the defect to the faulty wiring pattern 161 and at least one of the type and the size of the defect are respectively graded, and thereby the critical defect 181 is identified. In the result, the success rate of position identification of the critical defect 181 may be significantly improved.

MODULE AND APPLICATION EXAMPLES

A description will be given of application examples of the display manufactured by the method described in the foregoing respective embodiments. The display manufactured by the method of the foregoing respective embodiments is applicable to a display of an electronic device in any field for displaying an image signal inputted from outside or an image signal generated inside as an image or a picture, such as a television device, a digital camera, a notebook personal computer, a portable terminal device such as a mobile phone, and a video camera.

Module

Figure 23:
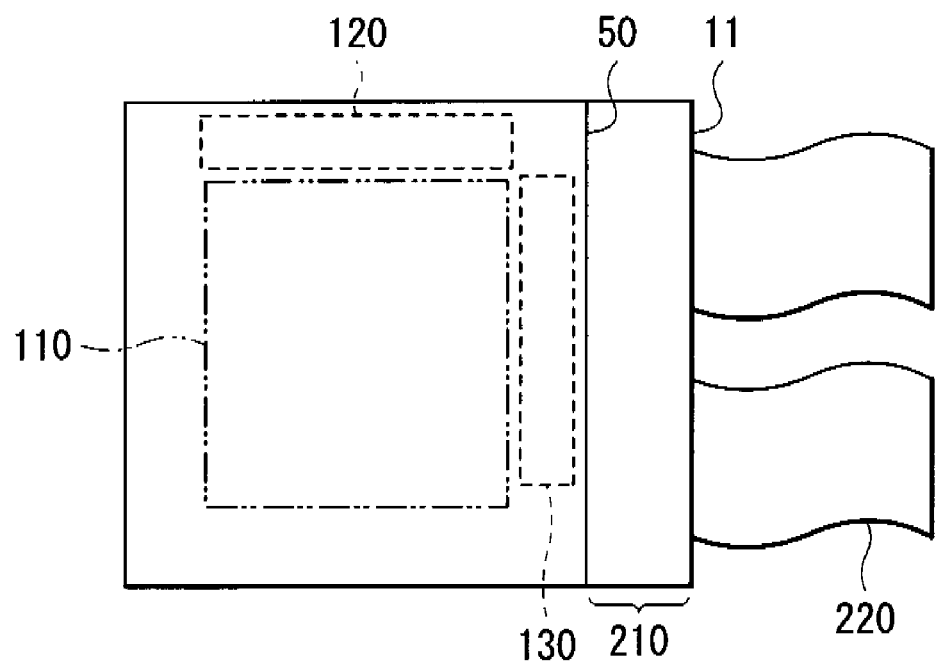
FIG. 23 is a plan view showing a schematic structure of a module including the display of the foregoing respective embodiments.

The display manufactured by the method of the foregoing respective embodiments is incorporated in various electronic devices such as after-mentioned first to fifth application examples as a module as shown in FIG. 23. In the module, for example, a region 210 exposed from the sealing substrate 30 and the adhesive layer 20 is provided on a side of the transcribed substrate 11, and an external connection terminal (not shown) is formed in the exposed region 210 by extending the wirings of the signal line driving circuit 120 and the scanning line driving circuit 130. The external connection terminal may be provided with a Flexible Printed Circuit (FPC) 220 for inputting and outputting a signal.

First Application Example

Figure 24:
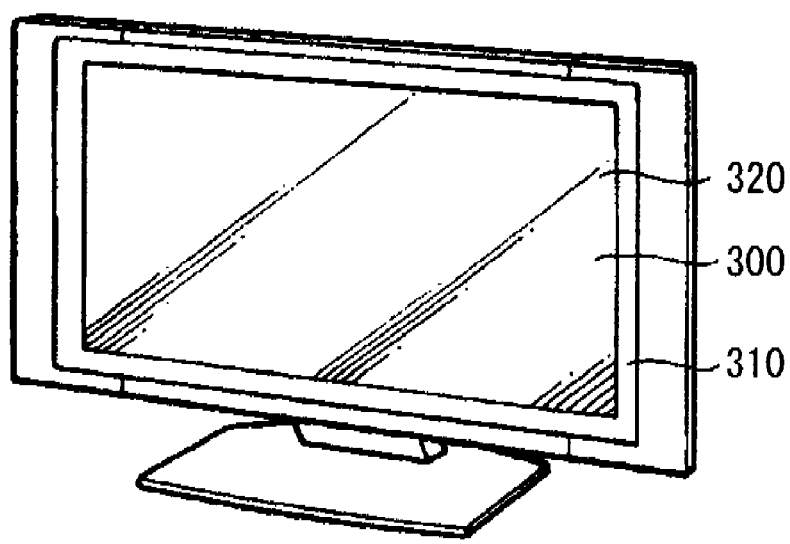
FIG. 24 is a perspective view showing an appearance of a first application example of the display of the foregoing respective embodiments.

FIG. 24 is an appearance of a television device to which the display manufactured by the method of the foregoing respective embodiments is applied. The television device has, for example, a picture display screen section 300 including a front panel 310 and a filter glass 320. The picture display screen section 300 is composed of the display manufactured by the method according to the foregoing respective embodiments.

Second Application Example

Figure 25A:
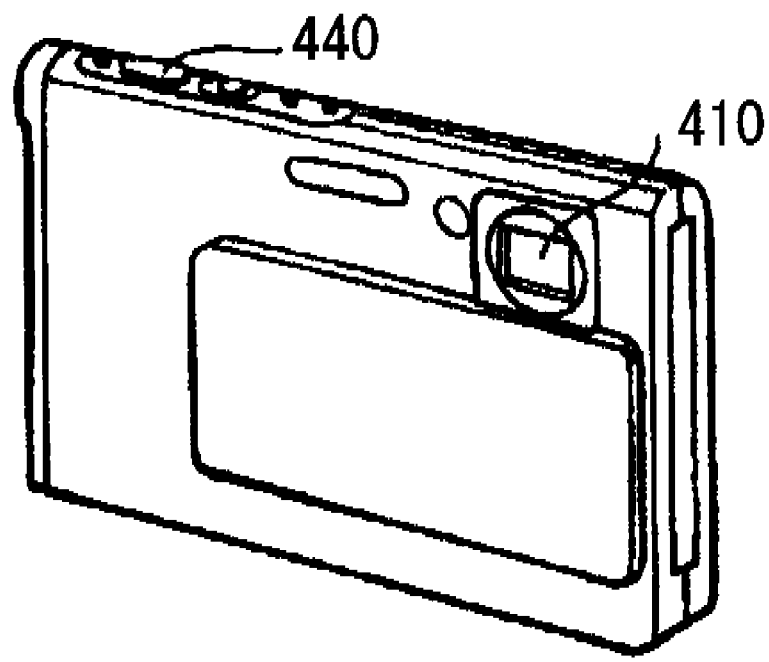
FIG. 25A is a perspective view showing an appearance viewed from the front side of a second application example.
Figure 25B:
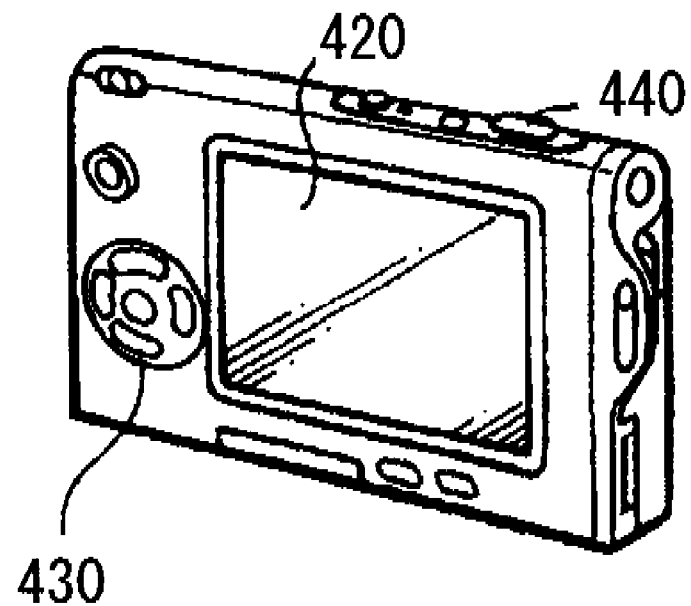
FIG. 25B is a perspective view showing an appearance viewed from the rear side of the second application example.

FIGS. 25A and 25B are an appearance of a digital camera to which the display manufactured by the method of the foregoing respective embodiments is applied. The digital camera has, for example, a light emitting section for a flash 410, a display section 420, a menu switch 430, and a shutter button 440. The display section 420 is composed of the display manufactured by the method according to the foregoing respective embodiments.

Third Application Example

Figure 26:
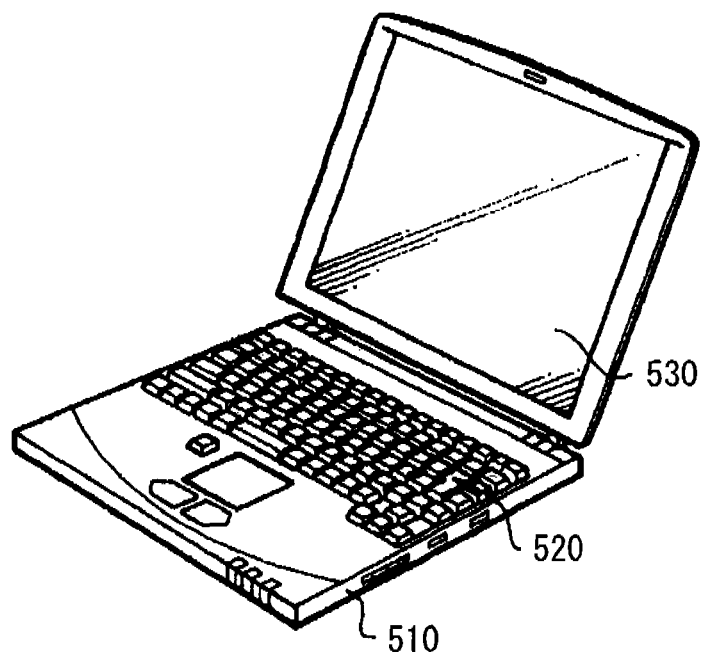
FIG. 26 is a perspective view showing an appearance of a third application example.

FIG. 26 is an appearance of a notebook personal computer to which the display manufactured by the method of the foregoing respective embodiments is applied. The notebook personal computer has, for example, a main body 510, a keyboard 520 for operation of inputting characters and the like, a display section 530 for displaying an image. The display section 530 is composed of the display manufactured by the method according to the foregoing respective embodiments.

Fourth Application Example

Figure 27:
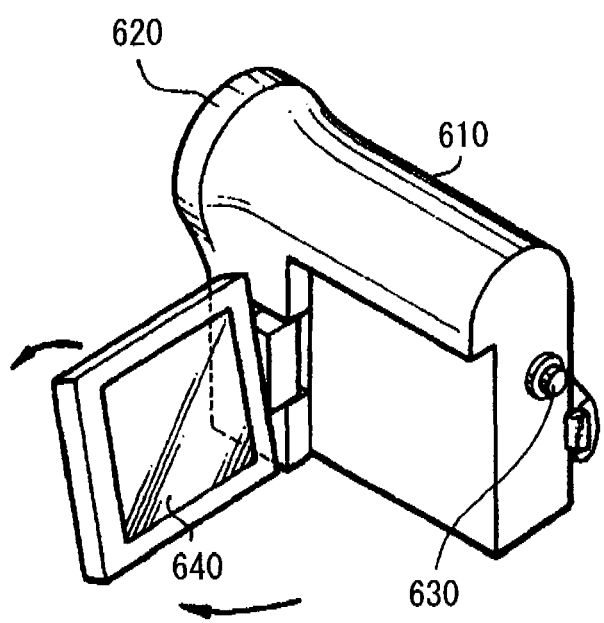
FIG. 27 is a perspective view showing an appearance of a fourth application example.
Figure 28:
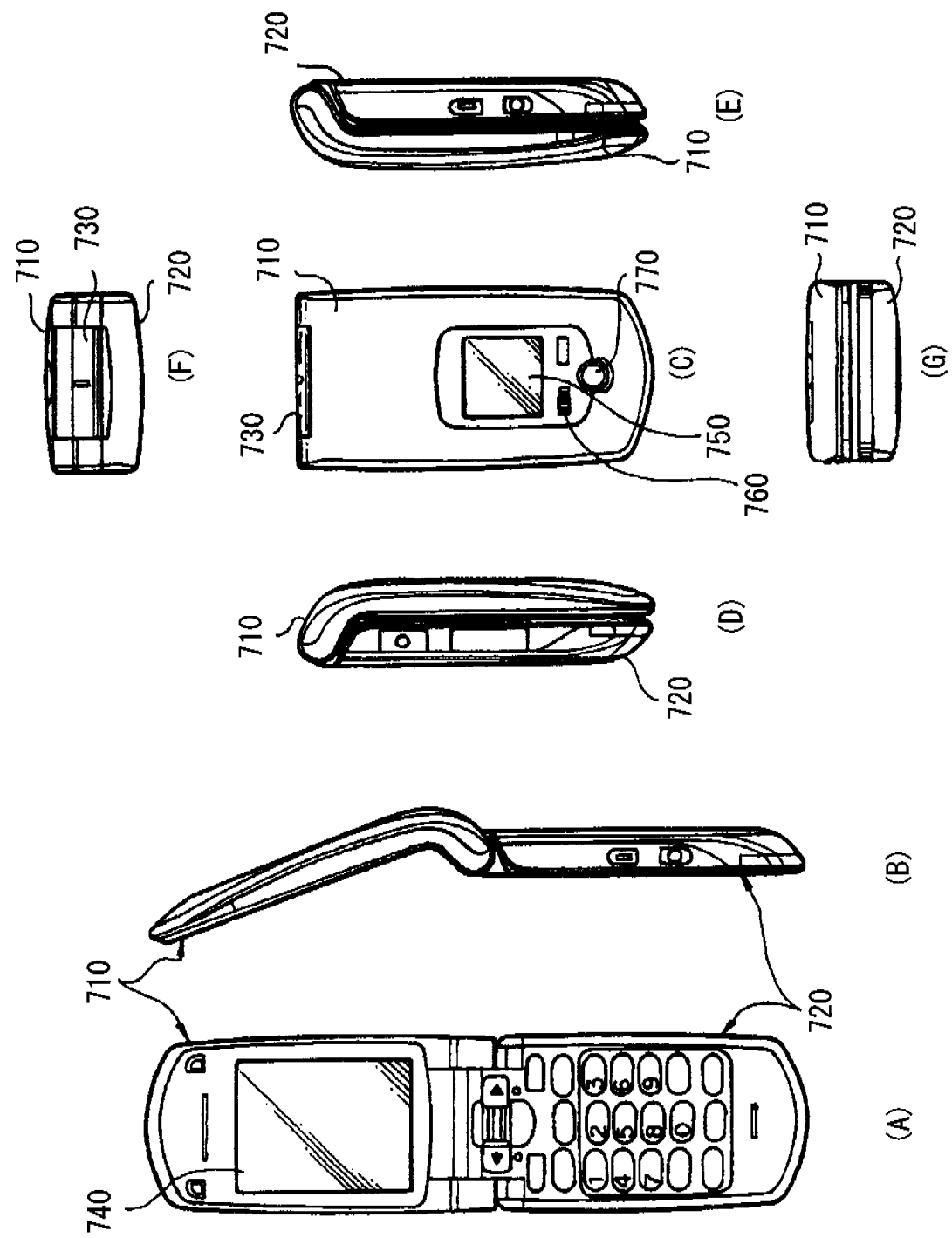
FIG. 28A is an elevation view of a fifth application example unclosed.
FIG. 28B is a side view thereof.
FIG. 28C is an elevation view of the fifth application example closed, FIG.
FIG. 28E is a right side view thereof.
FIG. 28F is a top view thereof.
FIG. 28G is a bottom view thereof.

FIG. 27 is an appearance of a video camera to which the display manufactured by the method of the foregoing respective embodiments is applied. The video camera has, for example, a main body 610, a lens for shooting an object 620 provided on the front side face of the main body 610, a start/stop switch in shooting 630, and a display section 640. The display section 640 is composed of the display manufactured by the method according to the foregoing respective embodiments.

Fifth Application Example

FIGS. 28A to 28G are an appearance of a mobile phone to which the display manufactured by the method of the foregoing respective embodiments is applied. In the mobile phone, for example, an upper package 710 and a lower package 720 are jointed by a joint section (hinge section) 730. The mobile phone has a display 740, a sub-display 750, a picture light 760, and a camera 770. The display 740 or the sub-display 750 is composed of the display manufactured by the method according to the foregoing respective embodiments.

While the present application has been described with reference to the embodiments, the present application is not limited to the foregoing embodiments, and various modifications may be made. For example, in the foregoing embodiments, the description has been given of the case that the method of manufacturing a display of the application is applied to the organic light emitting display using the organic light emitting devices 10R, 10G, and 10B. However, the application is widely applicable to other plane display such as a liquid crystal display.

Further, in the foregoing embodiments, the description has been given of the configuration of the third inspection and repair section 1400 with the specific example. However, the configuration of the third inspection and repair section is not limited to that of the foregoing embodiments. For example, in the foregoing embodiments, the description has been given of the case that the base 11 is moved to the optical system 1410 by the movement mechanism 1420. However, the optical system 1410 may be moved to the base 11, or the both thereof may be moved.

In addition, for example, in the foregoing embodiments, the description has been given of the case that the compressed gas G1 is used to float the local repair section 1431. However, the floatation method is not limited to the static floatation method by the compressed gas G1. Further, the local repair section 1431 may be fixed on, for example, a supporting column or the like.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The application is claimed as follows:

1. A method of manufacturing a substrate formed with a plurality of wiring patterns on a base, comprising:
   a first inspection step of identifying a faulty wiring pattern having electric short circuit or disconnection by performing an electric inspection respectively for the plurality of wiring patterns;
   a second inspection step of examining a relative position of a defect on the base and at least one of a type and a size of the defect by an optical inspection,
   a matching step of matching a result of the first inspection step with a result of the second inspection step, and identifying a critical defect having electric short circuit or disconnection; and
   a third inspection step of examining a relative position in a pixel and an effective range of the critical defect by an optical inspection.

2. The method of manufacturing a substrate according to claim 1, wherein after the third inspection step is performed, a repair step for repairing the critical defect is included.

3. The method of manufacturing a substrate according to claim 2, wherein after the third inspection step is performed, a repair procedure selection step for selecting a repair procedure based on at least a result of the third inspection step is included before the repair step is performed.

4. The method of manufacturing a substrate according to claim 3, wherein in the repair procedure selection step, the repair procedure is selected based on the result of the third inspection step and lower layer wiring information of the pixel including the critical defect.

5. The method of manufacturing a substrate according to claim 3, wherein in the repair procedure selection step, a disconnection procedure by laser irradiation and a connection procedure by laser CVD method or metal particle coating method are previously stored in a database, and at least one of the disconnection procedure and the connection procedure is selectively read from the database.

6. The method of manufacturing a substrate according to claim 5, wherein in the repair procedure selection step, determination is made whether or not a lower wiring exists in the effective range of the critical defect, and at least the connection procedure is read from the database if the lower layer wiring exists.

7. A substrate manufacturing system for manufacturing a substrate formed with a plurality of wiring patterns on a base, comprising:
   a first inspection section for identifying a faulty wiring pattern having electric short circuit or disconnection by performing an electric inspection respectively for the plurality of wiring patterns;
   a second inspection section for examining a relative position of a defect on the base and at least one of a type and a size of the defect by an optical inspection;
   a matching section for matching a result of the first inspection step with a result of the second inspection step, and identifying a critical defect having electric short circuit or disconnection; and
   a third inspection section for examining a relative position in a pixel and an effective range of the critical defect by an optical inspection.

8. The substrate manufacturing system according to claim 7, wherein the third inspection section comprises:
   an optical system for observing the critical defect;
   a movement mechanism for relatively moving the optical system and the base; and
   a repair mechanism for repairing the critical defect.

9. A method of manufacturing a display forming a display device on a substrate formed with a plurality of wiring patterns on a base, comprising:
   a first inspection step of identifying a faulty wiring pattern having electric short circuit or disconnection by performing an electric inspection respectively for the plurality of wiring patterns;
   a second inspection step of examining a relative position of a defect on the base and at least one of a type and a size of the defect by an optical inspection;
   a matching step of matching a result of the first inspection step with a result of the second inspection step, and identifying a critical defect having electric short circuit or disconnection;
   a third inspection step of examining a relative position in a pixel and an effective range of the critical defect by an optical inspection;
   a repair step of repairing the critical defect after the third inspection step is performed; and
   a display device formation step of forming the display device on the substrate with the critical defect repaired.

* * * * *